United States Patent
Uejima et al.

(10) Patent No.: US 11,476,226 B2
(45) Date of Patent: Oct. 18, 2022

(54) RADIO-FREQUENCY MODULE AND COMMUNICATION DEVICE

(71) Applicant: Murata Manufacturing Co., Ltd., Kyoto (JP)

(72) Inventors: Takanori Uejima, Kyoto (JP); Yuji Takematsu, Kyoto (JP); Naoya Matsumoto, Kyoto (JP); Shou Matsumoto, Kyoto (JP); Tetsuro Harada, Kyoto (JP); Dai Nakagawa, Kyoto (JP); Yutaka Sasaki, Kyoto (JP); Yuuki Fukuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/727,141

(22) Filed: Dec. 26, 2019

(65) Prior Publication Data

US 2020/0211998 A1  Jul. 2, 2020

(30) Foreign Application Priority Data

Dec. 28, 2018  (JP) ............................. JP2018-247192

(51) Int. Cl.
*H03F 1/56* (2006.01)
*H04B 1/40* (2015.01)
(Continued)

(52) U.S. Cl.
CPC .......... *H01L 24/48* (2013.01); *H01L 23/3121* (2013.01); *H01L 23/5386* (2013.01); *H01L 23/552* (2013.01); *H01L 23/66* (2013.01); *H01L 24/49* (2013.01); *H01L 25/18* (2013.01); *H03F 1/565* (2013.01); *H03F 3/245* (2013.01); *H03F 3/68* (2013.01); *H04B 1/40* (2013.01); *H01L 2223/6611* (2013.01); *H01L 2223/6655* (2013.01); *H01L 2223/6677* (2013.01);
(Continued)

(58) Field of Classification Search
CPC ... H01L 24/48–49; H01L 25/18; H01F 1/565; H03F 3/245
See application file for complete search history.

(56) References Cited

U.S. PATENT DOCUMENTS

| | | | | |
|---|---|---|---|---|
| 4,494,099 A | * | 1/1985 | Prijs ......................... | H01F 5/04 335/133 |
| 5,375,256 A | * | 12/1994 | Yokoyama ............. | H01Q 1/244 455/80 |

(Continued)

FOREIGN PATENT DOCUMENTS

| | | |
|---|---|---|
| CN | 108352361 A | 7/2018 |
| CN | 108964633 A | 12/2018 |

(Continued)

*Primary Examiner* — Gennadiy Tsvey
(74) *Attorney, Agent, or Firm* — Pearne & Gordon LLP

(57) ABSTRACT

A radio-frequency module includes: a transmitting circuit disposed on a mounting substrate to process a radio-frequency signal input from a transmission terminal and to output a resultant signal to a common terminal; a receiving circuit disposed on the mounting substrate to process a radio-frequency signal input from the common terminal and to output a resultant signal to a reception terminal; a first inductor included in a first transmitting circuit; and a bonding wire connected to the ground and bridging over the first inductor.

10 Claims, 13 Drawing Sheets

(51) Int. Cl.
  *H01L 23/00* (2006.01)
  *H01L 23/66* (2006.01)
  *H03F 3/24* (2006.01)
  *H03F 3/68* (2006.01)
  *H01L 23/31* (2006.01)
  *H01L 23/552* (2006.01)
  *H01L 25/18* (2006.01)
  *H01L 23/538* (2006.01)

(52) U.S. Cl.
  CPC ............ *H01L 2224/48091* (2013.01); *H01L 2224/48106* (2013.01); *H01L 2224/48229* (2013.01); *H01L 2224/49052* (2013.01); *H01L 2224/49175* (2013.01); *H01L 2924/14215* (2013.01); *H01L 2924/19042* (2013.01); *H01L 2924/3025* (2013.01); *H01L 2924/30111* (2013.01); *H03F 2200/165* (2013.01); *H03F 2200/171* (2013.01); *H03F 2200/222* (2013.01); *H03F 2200/294* (2013.01); *H03F 2200/451* (2013.01)

(56) References Cited

U.S. PATENT DOCUMENTS

| | | | |
|---|---|---|---|
| 6,429,536 B1 * | 8/2002 | Liu | H01L 24/85 257/E23.079 |
| 6,586,309 B1 * | 7/2003 | Yeo | H01L 23/5227 438/381 |
| 6,689,636 B2 * | 2/2004 | Liao | H01L 24/49 257/E23.079 |
| 6,707,146 B2 * | 3/2004 | Terui | H01L 23/50 257/667 |
| 6,787,896 B1 * | 9/2004 | Petty-Weeks | H01L 23/3677 257/700 |
| 7,939,864 B1 * | 5/2011 | Blednov | H01L 24/49 257/784 |
| 8,129,824 B1 * | 3/2012 | St. Amand | H01L 24/49 257/659 |
| 9,166,558 B2 * | 10/2015 | Fujiwara | H03H 7/0161 |
| 9,240,372 B1 * | 1/2016 | Liou | H01L 24/06 |
| 9,438,303 B2 * | 9/2016 | Onaka | H04B 1/48 |
| 10,027,287 B1 * | 7/2018 | Ichitsubo | H03F 3/72 |
| 10,141,643 B2 * | 11/2018 | Fujiwara | H04B 1/006 |
| 10,432,235 B2 * | 10/2019 | Thompson | H04B 7/04 |
| 2002/0067228 A1 * | 6/2002 | Hoffman | H01P 1/2053 333/202 |
| 2003/0042566 A1 * | 3/2003 | Chang | H01L 23/50 257/E23.079 |
| 2004/0036167 A1 * | 2/2004 | Sugiyama | H01L 24/48 257/E23.002 |
| 2004/0087286 A1 * | 5/2004 | Inoue | H04B 1/52 455/193.1 |
| 2004/0266378 A1 * | 12/2004 | Fukamachi | H03H 7/1783 455/188.1 |
| 2005/0012226 A1 * | 1/2005 | Chang | H01L 25/16 257/E23.079 |
| 2005/0040501 A1 * | 2/2005 | Hagen | H01L 23/3677 257/784 |
| 2007/0058748 A1 * | 3/2007 | Kim | H04B 1/52 375/295 |
| 2007/0241440 A1 | 10/2007 | Hoang et al. | |
| 2011/0234332 A1 * | 9/2011 | Takahashi | H04B 1/0458 333/1.1 |
| 2011/0261727 A1 * | 10/2011 | Han | H04B 1/52 370/277 |
| 2012/0188026 A1 * | 7/2012 | Yamaji | H03H 9/6483 333/133 |
| 2013/0016633 A1 * | 1/2013 | Lum | H04B 1/16 370/297 |
| 2013/0043961 A1 * | 2/2013 | Gebauer | H03H 9/0566 333/133 |
| 2013/0072253 A1 * | 3/2013 | Siomkos | H04B 1/006 455/550.1 |
| 2014/0167877 A1 * | 6/2014 | Shimizu | H03H 7/38 333/101 |
| 2014/0308906 A1 * | 10/2014 | Saji | H01L 23/5389 455/83 |
| 2015/0130559 A1 * | 5/2015 | Yokoyama | H03H 9/02118 333/133 |
| 2015/0326181 A1 * | 11/2015 | Chen | H01L 23/552 330/307 |
| 2016/0006556 A1 * | 1/2016 | Pehlke | H04B 1/0057 370/280 |
| 2016/0028156 A1 * | 1/2016 | Fujiwara | H04B 1/006 343/860 |
| 2016/0093577 A1 * | 3/2016 | Chen | H01L 23/552 257/659 |
| 2016/0336631 A1 * | 11/2016 | Lahteensuo | H01P 1/10 |
| 2017/0117231 A1 | 4/2017 | Awujoola et al. | |
| 2017/0141801 A1 * | 5/2017 | Watanabe | H03H 9/64 |
| 2017/0251576 A1 | 8/2017 | Jeong et al. | |
| 2017/0263568 A1 * | 9/2017 | Jeon | H01L 24/85 |
| 2017/0272057 A1 * | 9/2017 | Takata | H03H 7/38 |
| 2017/0338839 A1 * | 11/2017 | Little | H04B 1/56 |
| 2017/0373668 A1 * | 12/2017 | Nishihara | H03H 9/725 |
| 2018/0048345 A1 * | 2/2018 | Pehlke | H04B 1/40 |
| 2018/0098417 A1 | 4/2018 | Gebauer et al. | |
| 2018/0109243 A1 * | 4/2018 | Takamine | H03H 9/6483 |
| 2018/0123556 A1 * | 5/2018 | Takamine | H03H 9/725 |
| 2018/0131501 A1 * | 5/2018 | Little | H04B 1/0064 |
| 2018/0152191 A1 * | 5/2018 | Niwa | H04B 1/0458 |
| 2018/0166363 A1 | 6/2018 | Heppner et al. | |
| 2018/0337706 A1 | 11/2018 | Yamazaki et al. | |

FOREIGN PATENT DOCUMENTS

| | | | |
|---|---|---|---|
| JP | H10-200062 A | 7/1998 | |
| JP | 2001-177081 A | 6/2001 | |
| JP | 2004-342849 A | 12/2004 | |
| JP | 2004342849 A | * 12/2004 | ............ H01L 24/97 |
| JP | 2010045563 A | * 2/2010 | |
| KR | 2003091519 A | * 12/2003 | |

* cited by examiner

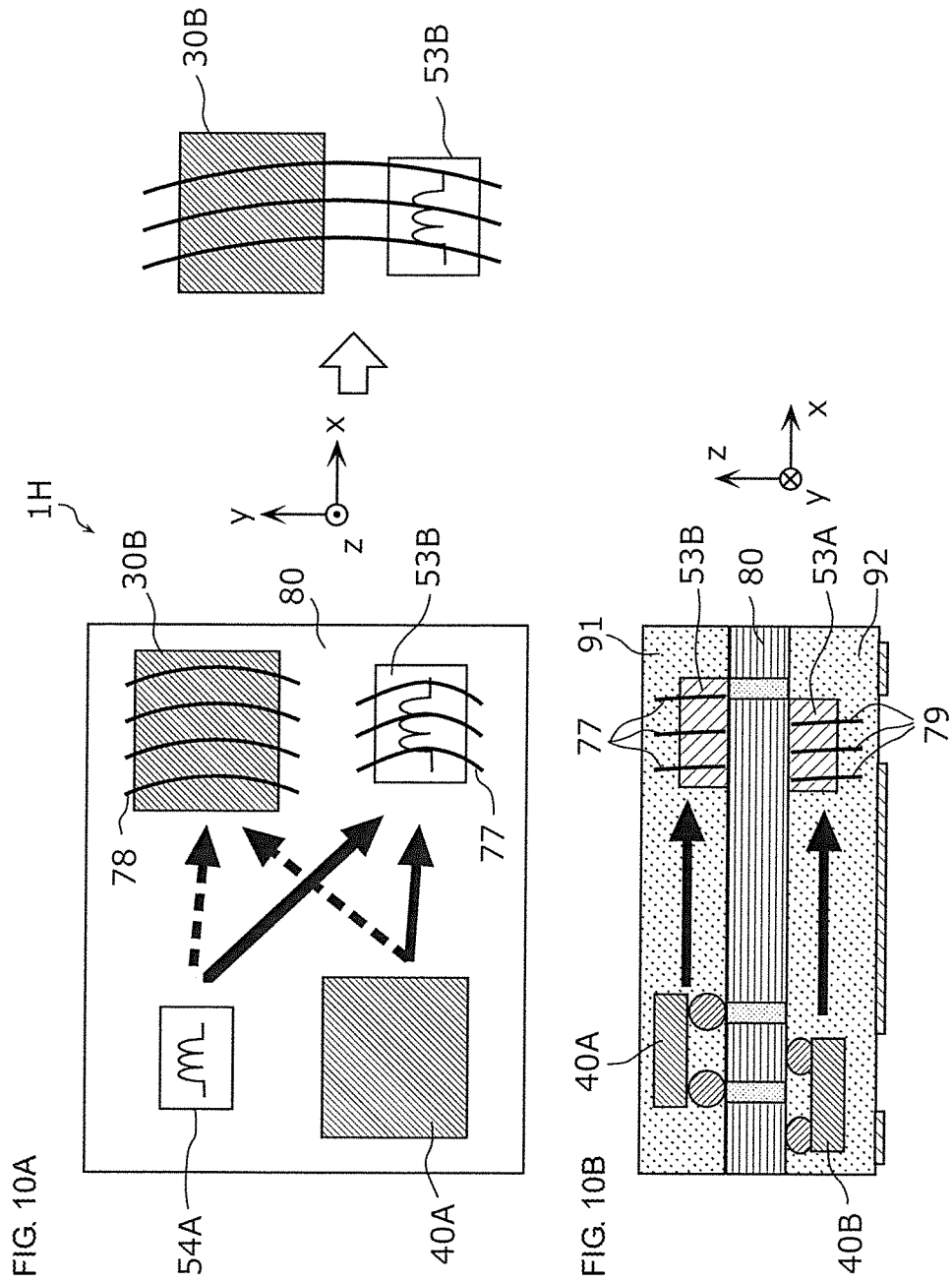

RADIO-FREQUENCY MODULE AND COMMUNICATION DEVICE

This application claims priority from Japanese Patent Application No. 2018-247192 filed on Dec. 28, 2018. The content of this application is incorporated herein by reference in its entirety.

BACKGROUND OF THE INVENTION

1. Field of the Invention

The present disclosure relates to a radio-frequency module and a communication device. The layout complexity of circuit elements constituting a radio-frequency front-end circuit for use in mobile communication devices such as mobile phones has been increasing, particularly due to adoption of advanced multi-band features.

Japanese Unexamined Patent Application Publication No. 2004-342849 discloses a sectional configuration of a radio-frequency module in which capacitive elements and semiconductor chips including amplifier elements are mounted on a mounting substrate. One of two opposed main surfaces of each semiconductor chip is connected to the mounting substrate or to another semiconductor chip with a planar electrode disposed therebetween, and the other main surface is connected to electrodes on the mounting substrate via bonding wires. When the mounting substrate is viewed in section, the bonding wires bridge over the capacitive elements.

When the radio-frequency module disclosed in Japanese Unexamined Patent Application Publication No. 2004-342849 is configured as a compact module including a transmitting circuit and a receiving circuit, which may consequently be disposed close to each other, magnetic coupling is conceivably produced between the inductance component of a circuit element disposed on a transmission path including the transmitting circuit and extending to an antenna connection terminal and the inductance component of a circuit element disposed on the reception path extending from the antenna connection terminal to the receiving circuit. Through the magnetic coupling, a high-power radio-frequency transmission signal amplified by a power amplifier of the transmitting circuit, harmonic components of the signal, or intermodulation distortion components resulting from mixing of the radio-frequency transmission signal with another radio-frequency signal flow into the receiving circuit, and as a result, the reception sensitivity of the receiving circuit may degrade. As a way to suppress such magnetic coupling, either of the two circuit elements may be provided with magnetic shielding.

Although the radio-frequency module disclosed in Japanese Unexamined Patent Application Publication No. 2004-342849 includes the bonding wires bridging over the capacitive elements, this configuration fails to suppress the occurrence of magnetic coupling between inductance components, and as a result, the reception sensitivity of the receiving circuit will degrade.

BRIEF SUMMARY

The present disclosure provides a radio-frequency module and a communication device in which the degradation of reception sensitivity is prevented.

A radio-frequency module according to an aspect of the present disclosure includes: a common terminal, a transmission terminal, and a reception terminal; a transmitting circuit disposed on a mounting substrate to process a radio-frequency signal input from the transmission terminal and to output a resultant signal to the common terminal; and a receiving circuit disposed on the mounting substrate to process a radio-frequency signal input from the common terminal and to output a resultant signal to the reception terminal. At least one of the transmitting circuit and the receiving circuit includes a first inductor and a bonding wire connected to the ground. The bonding wire bridges over the first inductor.

The present disclosure provides a radio-frequency module and a communication device in which the degradation of reception sensitivity is prevented.

Other features, elements, characteristics and advantages of the present disclosure will become more apparent from the following detailed description of embodiments of the present disclosure with reference to the attached drawings.

BRIEF DESCRIPTION OF THE SEVERAL VIEWS OF THE DRAWINGS

FIGS. 10A and 10B are schematic diagrams illustrating a planar configuration and a sectional configuration, respectively, of a radio-frequency module according to Modification 7 of Embodiment 2;

DETAILED DESCRIPTION

Figure 1:
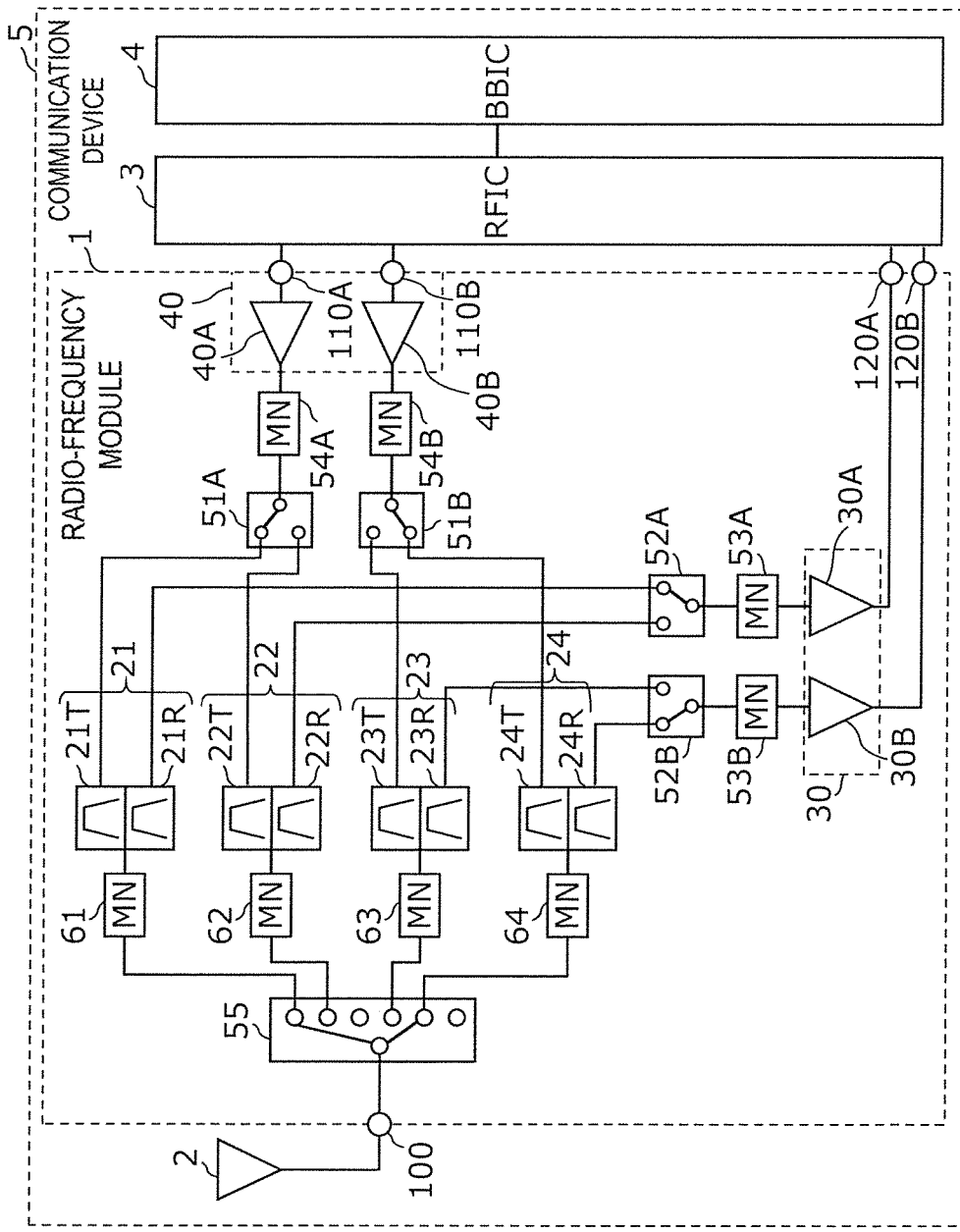
FIG. 1 is a circuit configuration diagram of a radio-frequency module and a communication device according to Embodiment 1.

Hereinafter, embodiments of the present disclosure and modifications thereof will be described in detail with reference to the drawings. The following embodiments and modifications thereof are general or specific examples. Details such as values, shapes, materials, constituent components, and arrangements and connection patterns of the constituent components in the following embodiments and modifications thereof are provided merely as examples and should not be construed as limiting the present disclosure. Of the constituent components in the following embodiments and modifications thereof, constituent components that are not mentioned in independent claims are described as freely selected constituent components. The sizes and the relative proportions of the constituent components illustrated in the drawings are not necessarily to scale.

The expression "A bridges over B" herein describes the arrangement in which A is disposed so as to face a main surface portion of B and two side surface portions of B that are opposed to each other with the main surface portion therebetween. The main surface portion and the side surface portions of B are not necessarily flat in a strict sense and may include, for example, curved faces and steps.

Regarding A, B, and C mounted on a substrate, the expression "when the substrate (or a main surface of the substrate) is viewed in plan, C is disposed between A and B" herein means that a line connecting a freely selected point in a region of A projected when the substrate is viewed in plan to a freely selected point in a region of B projected when the substrate is viewed in plan intersects at least part of a region of C projected when the substrate is viewed in plan.

Embodiment 1

1.1 Circuit Configuration of Radio-Frequency Module 1 and Communication Device 5

FIG. 1 is a circuit configuration diagram of a radio-frequency module 1 and a communication device 5 according to Embodiment 1. As illustrated in FIG. 1, the communication device 5 includes the radio-frequency module 1, an antenna 2, a radio-frequency integrated circuit (RFIC) 3, and a baseband integrated circuit (BBIC) 4.

The RFIC 3 is an RF signal processing circuit that processes radio-frequency signals transmitted or received via the antenna 2. Specifically, the RFIC 3 performs signal processing such as down-conversion on radio-frequency signals input through a reception signal path of the radio-frequency module 1 and outputs reception signals generated by the signal processing to the BBIC 4. The RFIC 3 performs signal processing such as up-conversion on transmission signals input from the BBIC 4 and outputs radio-frequency transmission signals generated by the signal processing to a transmission signal path of the radio-frequency module 1.

The BBIC 4 is a circuit that performs signal processing using intermediate frequency bands lower than the frequency bands of radio-frequency signals flowing through the radio-frequency module 1. The signals processed by the BBIC 4 are used, for example, as image signals for displaying an image or as audio signals for a telephone conversation through a speaker.

The RFIC 3 also functions as a control unit that controls, in accordance with the communication band (frequency band) in use, connections in switches 51A, 51B, 52A, 52B, and 55 included in the radio-frequency module 1. Specifically, the RFIC 3 switches, by using control signals (not illustrated), between connections in the individual switches 51A to 55 included in the radio-frequency module 1. The control unit may be disposed outside the RFIC 3. Specifically, the control unit is disposed, for example, in the radio-frequency module 1 or the BBIC 4.

The antenna 2 is connected to a common terminal 100 of the radio-frequency module 1 to radiate radio-frequency signals output by the radio-frequency module 1 and to enable the radio-frequency module 1 to receive radio-frequency signals from the outside.

The communication device 5 according to the present embodiment may optionally include the antenna 2 and the BBIC 4.

The following describes, in detail, the configuration of the radio-frequency module 1.

As illustrated in FIG. 1, the radio-frequency module 1 includes the common terminal 100, transmission terminals 110A and 110B, a low-noise amplifier circuit 30, a power amplifier circuit 40, duplexers 21, 22, 23, and 24, transmission matching circuits 54A and 54B, reception matching circuits 53A and 53B, matching circuits 61, 62, 63, and 64, and the switches 51A, 51B, 52A, 52B, and 55.

The common terminal 100 is connected to the antenna 2.

The low-noise amplifier circuit 30 includes low-noise amplifiers 30A and 30B. The low-noise amplifier 30A is a first low-noise amplifier that amplifies radio-frequency signals in a communication band A (a first communication band) and radio-frequency signals in a communication band B while ensuring low noise. The low-noise amplifier 30B is a second low-noise amplifier that amplifies radio-frequency signals in a communication band C (a second communication band) and radio-frequency signals in a communication band D while ensuring low noise.

The power amplifier circuit 40 includes power amplifiers 40A and 40B. The power amplifier 40A is a first power amplifier that amplifies radio-frequency signals in the communication band A (the first communication band) and radio-frequency signals in the communication band B. The power amplifier 40B is a second power amplifier that amplifies radio-frequency signals in the communication band C (the second communication band) and radio-frequency signals in the communication band D.

The duplexer 21 includes a transmitting filter 21T and a receiving filter 21R. The duplexer 22 includes a transmitting filter 22T and a receiving filter 22R. The duplexer 23 includes a transmitting filter 23T and a receiving filter 23R. The duplexer 24 includes a transmitting filter 24T and a receiving filter 24R.

The transmitting filter 21T is disposed on a transmission path connecting the power amplifier 40A to the common terminal 100. Of the radio-frequency transmission signals amplified by the power amplifier 40A, radio-frequency transmission signals transmitted in the communication band A pass through the transmitting filter 21T. The transmitting filter 22T is disposed on a transmission path connecting the power amplifier 40A to the common terminal 100. Of the radio-frequency transmission signals amplified by the power amplifier 40A, radio-frequency transmission signals transmitted in the communication band B pass through the transmitting filter 22T. The transmitting filter 23T is disposed on a transmission path connecting the power amplifier 40B to the common terminal 100. Of the radio-frequency transmission signals amplified by the power amplifier 40B, radio-frequency transmission signals transmitted in the communication band C pass through the transmitting filter 23T. The transmitting filter 24T is disposed on a transmission path connecting the power amplifier 40B to the common terminal 100. Of the radio-frequency transmission signals amplified by the power amplifier 40B, radio-frequency transmission signals transmitted in the communication band D pass through the transmitting filter 24T.

The receiving filter 21R is disposed on a reception path connecting the low-noise amplifier 30A to the common terminal 100. Of the radio-frequency reception signals input from the common terminal 100, radio-frequency reception signals received in the communication band A pass through the receiving filter 21R. The receiving filter 22R is disposed on a reception path connecting the low-noise amplifier 30A to the common terminal 100. Of the radio-frequency reception signals input from the common terminal 100, radio-frequency reception signals received in the communication band B pass through the receiving filter 22R. The receiving filter 23R is disposed on a reception path connecting the low-noise amplifier 30B to the common terminal 100. Of the radio-frequency transmission signals input from the common terminal 100, radio-frequency transmission signals received in the communication band C pass through the receiving filter 23R. The receiving filter 24R is disposed on a reception path connecting the low-noise amplifier 30B to the common terminal 100. Of the radio-frequency transmission signals input from the common terminal 100, radio-frequency transmission signals received in the communication band D pass through the receiving filter 24R.

The transmitting filters 21T to 24T and the receiving filters 21R to 24R may be surface acoustic wave filters, acoustic wave filters using bulk acoustic waves (BAWs), LC resonant filters, or dielectric filters but are not limited thereto.

The transmission matching circuit 54A is disposed on a transmission path connecting the power amplifier 40A to the transmitting filters 21T and 22T and matches the impedance of the power amplifier 40A to the impedance of the transmitting filters 21T and 22T. The transmission matching circuit 54B is disposed on a transmission path connecting the power amplifier 40B to the transmitting filters 23T and 24T and matches the impedance of the power amplifier 40B to the impedance of the transmitting filters 23T and 24T.

The transmission matching circuit 54A includes one or more first inductors (first transmission matching inductors) connected to an output terminal of the power amplifier 40A. The transmission matching circuit 54B includes one or more first inductors (first transmission matching inductors) connected to an output terminal of the power amplifier 40B. Each of the transmission matching circuits 54A and 54B may include, in addition to one or more first inductors, one or more matching capacitors.

The reception matching circuit 53A is disposed on a reception path connecting the low-noise amplifier 30A to the receiving filters 21R and 22R and matches the impedance of the low-noise amplifier 30A to the impedance of the receiving filters 21R and 22R. The reception matching circuit 53B is disposed on a reception path connecting the low-noise amplifier 30B to the receiving filters 23R and 24R and matches the impedance of the low-noise amplifier 30B to the impedance of the receiving filters 23R and 24R.

The reception matching circuit 53A includes one or more first inductors (first reception matching inductors) connected to an input terminal of the low-noise amplifier 30A. The reception matching circuit 53B includes one or more first inductors (first reception matching inductors) connected to an input terminal of the low-noise amplifier 30B. Each of the reception matching circuits 53A and 53B may include, in addition to one or more first inductors, one or more matching capacitors.

The switch 51A is disposed on a transmission path connecting the transmission matching circuit 54A to the transmitting filters 21T and 22T and switches between the state in which the power amplifier 40A is connected to the transmitting filter 21T and the state in which the power amplifier 40A is connected to the transmitting filter 22T. The switch 51A is configured as, for example, a single-pole, double-throw (SPDT) switching circuit including a common terminal connected to the transmission matching circuit 54A and two selection terminals respectively connected to the transmitting filter 21T and the transmitting filter 22T. The switch 51B is disposed on a transmission path connecting the transmission matching circuit 54B to the transmitting filters 23T and 24T and switches between the state in which the power amplifier 40B is connected to the transmitting filter 23T and the state in which the power amplifier 40B is connected to the transmitting filter 24T. The switch 51B is configured as, for example, an SPDT switching circuit including a common terminal connected to the transmission matching circuit 54B and two selection terminal respectively connected to the transmitting filter 23T and the transmitting filter 24T.

The switch 52A is disposed on a reception path connecting the reception matching circuit 53A to the receiving filters 21R and 22R and switches between the state in which the low-noise amplifier 30A is connected to the receiving filter 21R and the state in which the low-noise amplifier 30A is connected to the receiving filter 22R. The switch 52A is configured as, for example, an SPDT switching circuit including a common terminal connected to the reception matching circuit 53A and two selection terminals respectively connected to the receiving filter 21R and the receiving filter 22R. The switch 52B is disposed on a reception path connecting the reception matching circuit 53B to the receiving filters 23R and 24R and switches between the state in which the low-noise amplifier 30B is connected to the receiving filter 23R and the state in which the low-noise amplifier 30B is connected to the receiving filter 24R. The switch 52B is configured as, for example, an SPDT switching circuit including a common terminal connected to the reception matching circuit 53B and two selection terminals respectively connected to the receiving filter 23R and the receiving filter 24R.

The switch 55 is disposed on a signal path connecting the common terminal 100 to the transmitting filters 21T to 24T and the receiving filters 21R to 24R and switches among a state (1) in which the common terminal 100 is connected to the transmitting filter 21T and the receiving filter 21R, a state (2) in which the common terminal 100 is connected to the transmitting filter 22T and the receiving filter 22R, a state (3) in which the common terminal 100 is connected to the transmitting filter 23T and the receiving filter 23R, and a state (4) in which the common terminal 100 is connected to the transmitting filter 24T and the receiving filter 24R. The switch 55 is configured as a multi-connection switching circuit capable of setting the common terminal 100 into two or more of the states (1) to (4) at the same time.

The matching circuit 61 is disposed on a path connecting the switch 55 to the transmitting filter 21T and the receiving filter 21R and matches the impedance of the antenna 2 and the switch 55 to the impedance of the transmitting filter 21T and the receiving filter 21R. The matching circuit 62 is disposed on a path connecting the switch 55 to the transmitting filter 22T and the receiving filter 22R and matches the impedance of the antenna 2 and the switch 55 to the impedance of the transmitting filter 22T and the receiving filter 22R. The matching circuit 63 is disposed on a path connecting the switch 55 to the transmitting filter 23T and the receiving filter 23R and matches the impedance of the antenna 2 and the switch 55 to the impedance of the transmitting filter 23T and the receiving filter 23R. The matching circuit 64 is disposed on a path connecting the switch 55 to the transmitting filter 24T and the receiving filter 24R and matches the impedance of the antenna 2 and the switch 55 to the impedance of the transmitting filter 24T and the receiving filter 24R.

Each of the matching circuits 61 to 64 includes one or more first inductors. Each of the matching circuits 61 to 64 may include, in addition to one or more first inductors, one or more matching capacitors.

In the radio-frequency module 1 configured as described above, the power amplifier 40A, the transmission matching circuit 54A, and the transmitting filter 21T constitute a first transmitting circuit, which outputs radio-frequency transmission signals in the communication band A (the first communication band) to the common terminal 100. The power amplifier 40B, the transmission matching circuit 54B, and the transmitting filter 23T constitute a second transmitting circuit, which outputs radio-frequency transmission signals in the communication band C (the second communication band) to the common terminal 100. The first and second transmitting circuits constitute a transmitting circuit that processes radio-frequency signals input from the transmission terminals 110A or 110B and outputs the resultant signals to the common terminal 100.

The low-noise amplifier 30A, the reception matching circuit 53A, and the receiving filter 21R constitute a first receiving circuit, which receives, from the antenna 2 via the common terminal 100, radio-frequency reception signals in the communication band A (the first communication band). The low-noise amplifier 30B, the reception matching circuit 53B, and the receiving filter 23R constitute a second receiving circuit, which receives, from the antenna 2 via the common terminal 100, radio-frequency reception signals in the communication band C (the second communication band). The first and second receiving circuits constitute a receiving circuit that processes radio-frequency signals input from the common terminal 100 and outputs the resultant signals to the reception terminals 120A or 120B.

The circuit configuration above enables the radio-frequency module 1 according to the present embodiment to transmit and receive radio-frequency signals in the communication band A, B, C, or D. The circuit configuration above also enables simultaneous transmission, simultaneous reception, or simultaneous transmission and reception of radio-frequency signals in the communication band A or B and radio-frequency signals in the communication band C or D.

The radio-frequency module according to the present disclosure includes, a transmitting circuit including at least one of the power amplifier 40A, the transmission matching circuit 54A, and the transmitting filter 21T; and a receiving circuit including at least one of the low-noise amplifier 30A, the reception matching circuit 53A, and the receiving filter 21R and further includes at least one of the transmission matching circuit 54A, the reception matching circuit 53A, and the matching circuit 61. The transmission matching circuit 54A, the reception matching circuit 53A, and the matching circuit 61 include the first inductors that provide impedance matching between the two respective circuit elements of the radio-frequency module 1.

When the circuit elements constituting the radio-frequency module 1 above are configured as a single module to provide a compact front-end circuit, a transmitting circuit and a receiving circuit may, for example, be disposed close to each other, such that magnetic coupling is conceivably produced between the inductance component of the transmitting circuit (e.g., the transmission matching circuit 54A or 54B) and the inductance component of the receiving circuit (e.g., the reception matching circuit 53A or 53B). Through the magnetic coupling, a high-power radio-frequency transmission signal amplified by the power amplifier 40A or 40B, harmonic components of the signal, or intermodulation distortion components resulting from mixing of the radio-frequency transmission signal with another radio-frequency signal can flow into the receiving circuit, and as a result, the reception sensitivity of the receiving circuit may degrade.

To address this problem, the radio-frequency module 1 according to the present embodiment has a configuration that suppresses the occurrence of magnetic coupling between the inductance component of the transmitting circuit and the inductance component of the receiving circuit. The following describes, in detail, a configuration of the radio-frequency module 1 according to the present embodiment that suppresses the occurrence of magnetic coupling.

1.2 Layout of Circuit Elements of Radio-Frequency Module 1

Figure 2A:
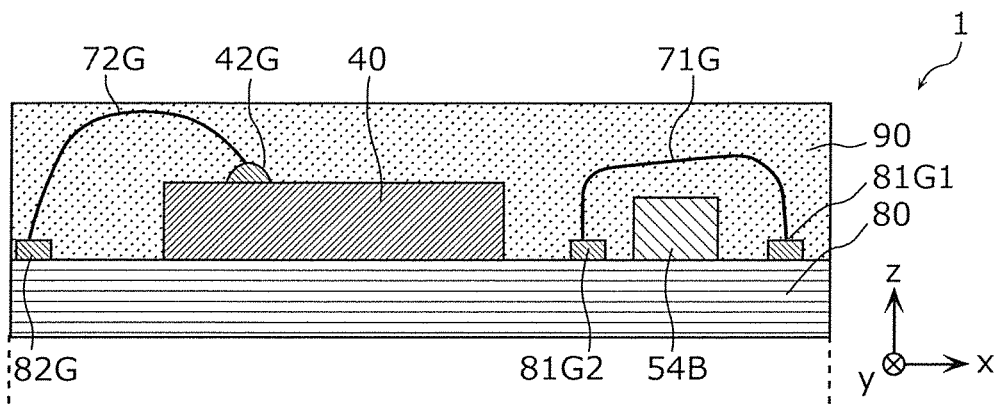
FIGS. 2A and 2B are schematic diagrams illustrating a sectional configuration and a planar configuration, respectively, of the radio-frequency module according to Embodiment 1.
Figure 2B:
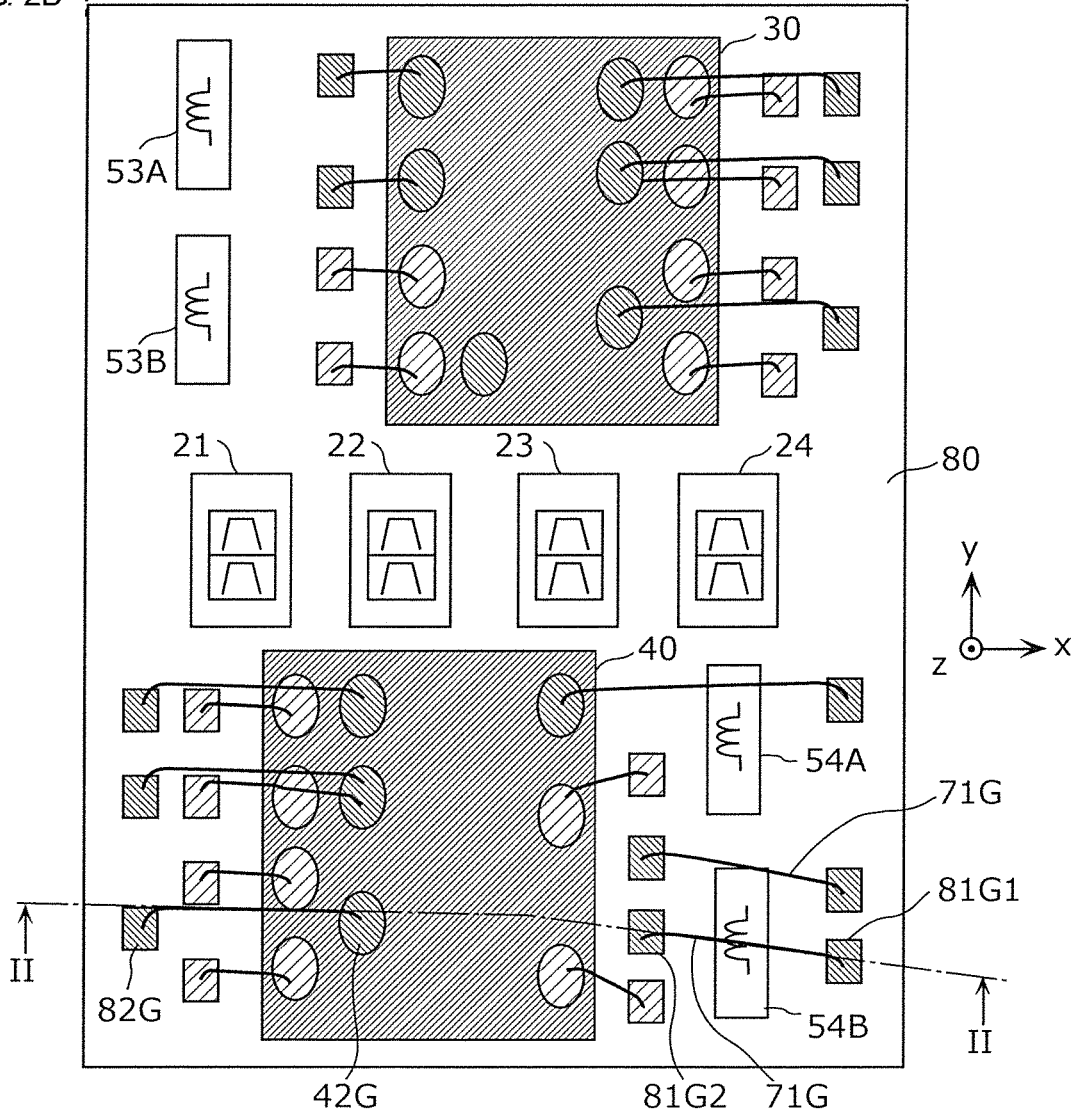

FIGS. 2A and 2B are schematic diagrams illustrating a sectional configuration and a planar configuration, respectively, of the radio-frequency module 1 according to Embodiment 1. FIG. 2A is a schematic diagram illustrating a sectional configuration of the radio-frequency module 1. Specifically, FIG. 2A illustrates a section taken along line II-II in FIG. 2B.

As illustrated in FIGS. 2A and 2B, the radio-frequency module 1 according to the present embodiment includes, in addition to the circuit configuration illustrated in FIG. 1, a mounting substrate 80, bonding wires 71G and 72G, and a resin member 90. The bonding wires 71G and 72G are included in the transmitting circuit.

The mounting substrate 80 is a substrate on which the transmitting circuit and the receiving circuit mentioned above are mounted. The mounting substrate 80 is, for example, a low-temperature co-fired ceramic (LTCC) substrate including a plurality of dielectric layers stacked on top of one another or a printed circuit board.

As illustrated in FIG. 2B, the low-noise amplifier circuit 30, the power amplifier circuit 40, the reception matching circuits 53A and 53B, the transmission matching circuits 54A and 54B, and the duplexers 21 to 24 are surface-mounted to a main surface of the mounting substrate 80.

The power amplifier circuit 40 is constructed of a semiconductor IC including the power amplifiers 40A and 40B embedded therein. The semiconductor IC may include, in addition to the power amplifiers 40A and 40B, the switches 51A to 55 and a digital control circuit embedded therein.

The low-noise amplifier circuit 30 is constructed of a semiconductor IC including the low-noise amplifiers 30A and 30B embedded therein. The semiconductor IC may include, in addition to the low-noise amplifiers 30A and 30B, the switches 51A to 55 and a digital control circuit embedded therein.

The semiconductor IC is, for example, a complementary metal oxide semiconductor (CMOS). Such a semiconductor IC is produced inexpensively. The semiconductor IC may be formed from GaAs. Such a semiconductor IC enables output of radio-frequency signals with excellent amplification performance and noise performance.

The resin member 90 is disposed on the mounting substrate 80 to cover at least part of the transmitting circuit and at least part of the receiving circuit so as to ensure reliability, such as mechanical strength reliability and moisture resistance reliability, of the circuit elements constituting the transmitting circuit and the receiving circuit. The radio-frequency module according to the present disclosure may optionally include the resin member 90.

One end of the bonding wire 72G is connected directly to a ground electrode 42G formed on one of the two opposed main surfaces of the power amplifier circuit 40 that is farther from the mounting substrate 80 (hereinafter referred to as a top surface) than the other main surface of the power amplifier circuit 40, and the other end of the bonding wire 72G is connected directly to a ground electrode 82G formed on the mounting substrate 80.

One end of the bonding wire 71G is connected directly to a ground electrode 81G1 formed on the mounting substrate 80 and the other end of the bonding wire 71G is connected directly to a ground electrode 81G2 formed on the mounting substrate 80. That is, the bonding wire 71G is connected to the ground. As illustrated in FIG. 2A, the bonding wire 71G bridges over (the first inductor of) the transmission matching circuit 54B. Specifically, as illustrated in FIG. 2B, the bonding wire 71G overlaps (the first inductor of) the transmission matching circuit 54B when the mounting substrate 80 is viewed in plan (viewed in a direction perpendicular to a main surface of the mounting substrate 80). As illustrated in FIG. 2A, the bonding wire 71G bridges over (the first inductor of) the transmission matching circuit 54B when the mounting substrate 80 is viewed in section (viewed in a direction parallel to the main surface of the mounting substrate 80).

The bonding wire 71G configured as described above suppresses the occurrence of magnetic coupling between the first inductor of the transmission matching circuit 54B as the inductance component of the transmitting circuit and the inductance component of the receiving circuit. This eliminates or reduces the possibility that a high-power radio-frequency transmission signal amplified by the power amplifier 40A or 40B, harmonic components of the signal, or intermodulation distortion components resulting from mixing of the radio-frequency transmission signal with another radio-frequency signal will flow into the receiving circuit through the magnetic coupling. The transmitting circuit and the receiving circuit consequently have improved isolation characteristics, which eliminate or reduce the possibility that the reception sensitivity of the receiving circuit will degrade.

The configuration of the bonding wire 71G according to the present embodiment eliminates or reduces the possibility that the transmitting circuit will produce a magnetic field, which will become the source of noise components in the receiving circuit.

As illustrated in FIG. 2A, the bonding wire 71G of the radio-frequency module 1 according to the present embodiment bridges over (the first inductor of) the transmission matching circuit 54B alone.

The bonding wire 71G connected to the ground is disposed closer to the first inductor of the transmission matching circuit 54B accordingly, thus providing a more efficient shield against the magnetic field produced by the first inductor. The transmitting circuit and the receiving circuit consequently have improved isolation characteristics, which effectively eliminate or reduce the possibility that the reception sensitivity of the receiving circuit will degrade.

As illustrated in FIG. 2B, a plurality of bonding wires 71G (a plurality of first bonding wires) connected to the ground may be disposed parallel to each other.

The plurality of bonding wires 71G parallel to each other provide a stronger shield against the magnetic field produced by the first inductor. The transmitting circuit and the receiving circuit consequently have improved isolation characteristics, which eliminate or reduce the possibility that the reception sensitivity of the receiving circuit will degrade.

Although not illustrated in FIGS. 2A and 2B, the bonding wire bridging over the first inductor of the transmission matching circuit 54B may include the plurality of bonding wires 71G (the plurality of first bonding wires) connected to the ground and parallel to each other and a plurality of second bonding wires intersecting the plurality of bonding wires 71G when the mounting substrate 80 is viewed in plan. In this case, the plurality of first bonding wires bridge over (the first inductor of) the transmission matching circuit 54B and the plurality of second bonding wires may bridge over (the first inductor of) the transmission matching circuit 54B.

The plurality of bonding wires intersecting each other provide a stronger shield against the magnetic field produced by the first inductor. The transmitting circuit and the receiving circuit consequently have improved isolation characteristics, which eliminate or reduce the possibility that the reception sensitivity of the receiving circuit will degrade.

In the radio-frequency module 1 according to the present embodiment, the transmitting circuit includes the transmitting filters 21T to 24T and the receiving circuit includes the receiving filters 21R to 24R. As illustrated in FIG. 2B, when the mounting substrate 80 is viewed in plan, the transmitting filters 21T to 24T in the respective duplexers 21 to 24 and the receiving filters 21R to 24R in the respective duplexers 21 to 24 may be disposed on or around the boundary between the region in which the transmitting circuit is disposed and the region in which the receiving circuit is disposed.

In this configuration, the low-noise amplifier circuit 30 and the reception matching circuits 53A and 53B face the power amplifier circuit 40 and the transmission matching circuits 54A and 54B via the transmitting filters 21T to 24T and the receiving filters 21R to 24R, which are circuit elements including conductive members. The transmitting filters and the receiving filters constituting the respective duplexers 21 to 24 include a plurality of conductive members such as signal extraction electrodes, at least one of which is, for example, connected to a ground pattern disposed on the mounting substrate 80. Thus, at least one of the duplexers 21 to 24 provides a shield against the inductance component generated by the transmitting circuit and the inductance component generated by the receiving circuit. This suppresses the occurrence of magnetic coupling between the transmitting circuit and the receiving circuit, and the transmitting circuit and the receiving circuit have improved isolation characteristics accordingly.

In the radio-frequency module 1 according to the present embodiment, the direction of the magnetic flux (winding axis) of (the first inductor of) the transmission matching circuit 54B may be perpendicular to the main surface of the mounting substrate 80.

The bonding wire 71G connected to the ground is thus disposed in the direction in which the magnetic flux of (the first inductor of) the transmission matching circuit 54B extends, and this configuration provides a stronger shield against the magnetic field produced by the first inductor. This eliminates or reduces the possibility that the reception sensitivity of the receiving circuit will degrade, and the transmitting circuit and the receiving circuit have improved isolation characteristics accordingly.

As illustrated in FIG. 2B, when bonding wires (HOT) that transmit radio-frequency signals and bonding wires (GND) connected to the ground are arranged substantially parallel to each other in the radio-frequency module 1 according to the present embodiment, electrodes on the top surface of the power amplifier circuit 40 or the top surface of the low-noise amplifier circuit 30 are arranged in such a manner that signal pad electrodes (HOT) are on the outer perimeter side and the ground pad electrodes (GND) are on the inner perimeter side (closer to the center). In one embodiment, the bonding wires (HOT) are considered to be parallel to the bonding wires (GND) when an angle between the extended imaginary lines of the bonding wire (HOT) and the bonding wire (GND) is XX degree or more and XX degree or less.

When radio-frequency signals flow into a signal bonding wire, a magnetic field is produced around the wire. The magnetic field may extend across the radio-frequency module 1, possibly causing undesired interference.

In the above-mentioned configuration, meanwhile, each signal bonding wire (HOT) is covered with a corresponding ground bonding wire (GND) (each ground bonding wire (GND) bridges over a corresponding signal bonding wire (HOT)). This layout suppresses extension of the magnetic field and eliminates or reduces signal interference accordingly. This layout also eliminates or reduces the possibility that signals from the outside will leak into the power amplifier circuit 40 and the low-noise amplifier circuit 30 through the signal bonding wires.

1.3 Layout of Circuit Elements of Radio-Frequency Module 1A

Figure 3A:
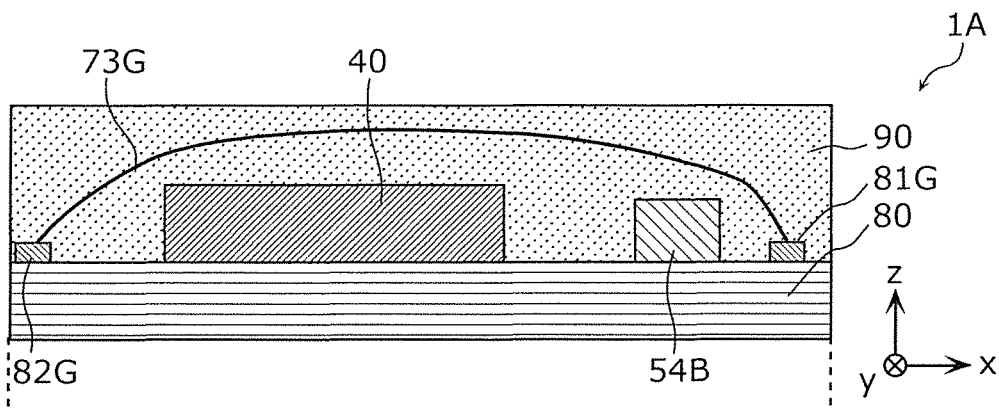
FIGS. 3A and 3B are schematic diagrams illustrating a sectional configuration and a planar configuration, respectively, of a radio-frequency module according to Modification 1 of Embodiment 1.
Figure 3B:
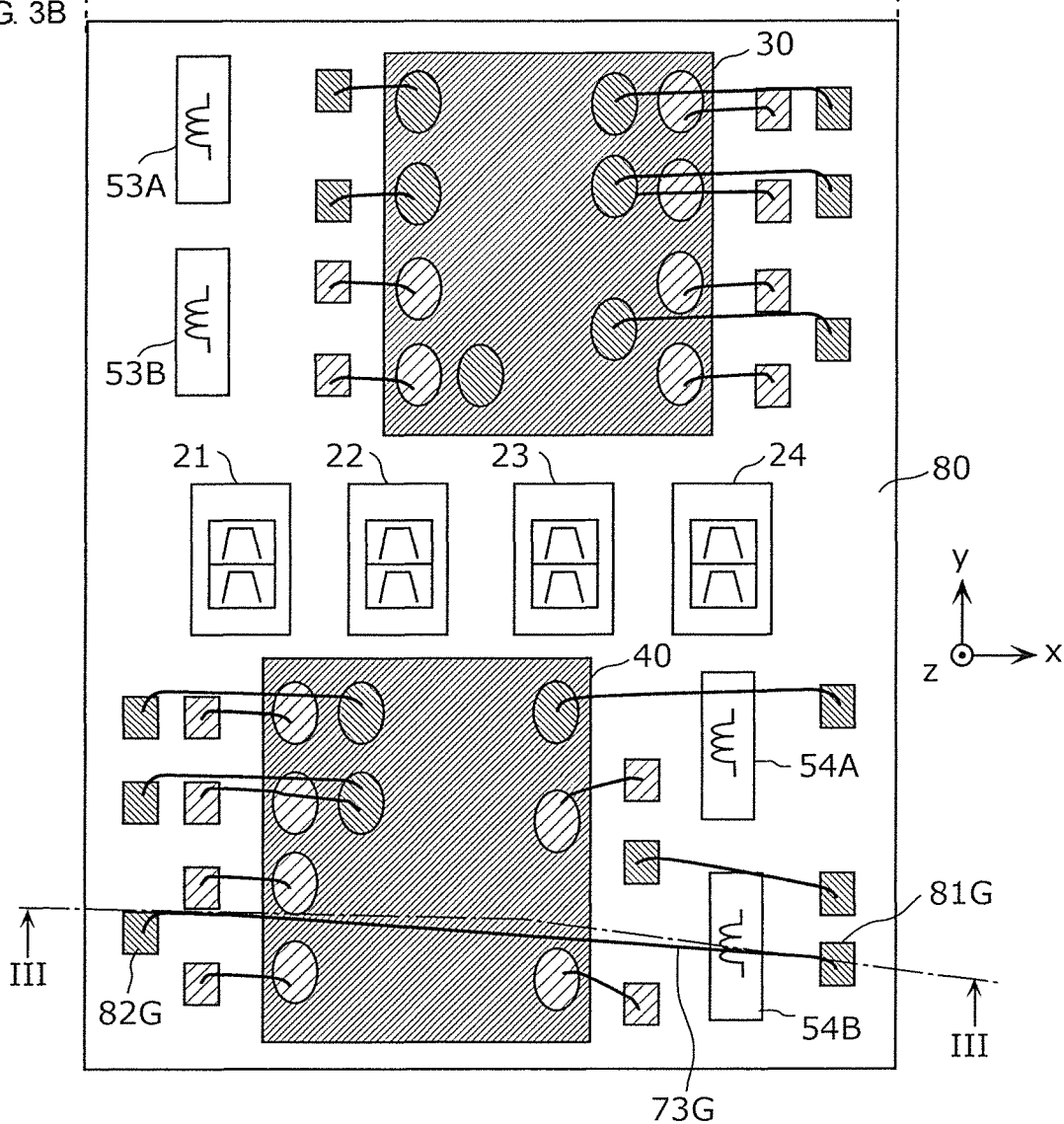

FIGS. 3A and 3B are schematic diagrams illustrating a sectional configuration and a planar configuration, respectively, of a radio-frequency module 1A according to Modification 1 of Embodiment 1. FIG. 3A is a schematic diagram illustrating a sectional configuration of the radio-frequency module 1A. Specifically, FIG. 3A illustrates a section taken along line III-III in FIG. 3B. The difference between the radio-frequency module 1A according to the present modification and the radio-frequency module 1 according to Embodiment 1 is only in the layout of the bonding wire bridging over the transmission matching circuit 54B. Configurations common to the radio-frequency module 1A according to the present modification and the radio-frequency module 1 according to Embodiment 1 will be omitted from the following description, which will be given while focusing on distinctive features of the radio-frequency module 1A.

A bonding wire 73G is included in the transmitting circuit. One end of the bonding wire 73G is connected directly to a ground electrode 81G formed on the mounting substrate 80 and the other end of the bonding wire 73G is connected directly to the ground electrode 82G formed on the mounting substrate 80. That is, the bonding wire 73G is connected to the ground. As illustrated in FIG. 3A, the bonding wire 73G bridges over (the first inductor of) the transmission matching circuit 54B and the power amplifier circuit 40. Specifically, as illustrated in FIG. 3B, the bonding wire 73G overlaps (the first inductor of) the transmission matching circuit 54B and the power amplifier circuit 40 when the mounting substrate 80 is viewed in plan. As illustrated in FIG. 3A, the bonding wire 73G bridges over (the first inductor of) the transmission matching circuit 54B and the power amplifier circuit 40 when the mounting substrate 80 is viewed in section.

The bonding wire 73G configured as described above suppresses the occurrence of magnetic coupling between the first inductor of the transmission matching circuit 54B as the inductance component of the transmitting circuit and the inductance component of the receiving circuit. The bonding wire 73G also produces a shielding effect, which eliminates or reduces the possibility that radio-frequency transmission signals radiated by the power amplifier circuit 40 will leak out. This eliminates or reduces the possibility that a high-power radio-frequency transmission signal amplified by the power amplifier 40A or 40B, harmonic components of the signal, or intermodulation distortion components resulting from mixing of the radio-frequency transmission signal with another radio-frequency signal will flow into the receiving circuit through the magnetic coupling. The transmitting circuit and the receiving circuit consequently have improved isolation characteristics, which eliminate or reduce the possibility that the reception sensitivity of the receiving circuit will degrade.

1.4 Layout of Circuit Elements of Radio-Frequency Module 1B

Figure 4A:
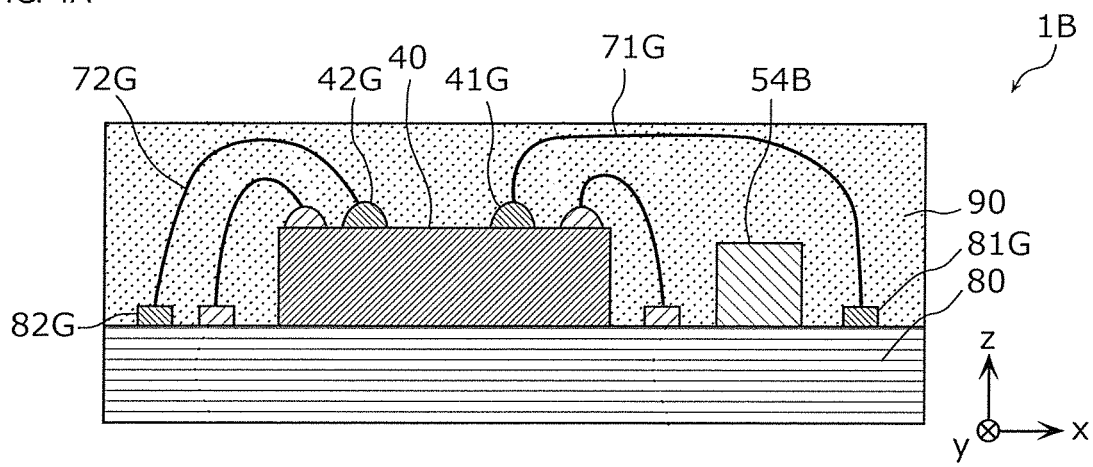
FIGS. 4A and 4B are schematic diagrams illustrating a sectional configuration and a planar configuration, respectively, of a radio-frequency module according to Modification 2 of Embodiment 1.
Figure 4B:
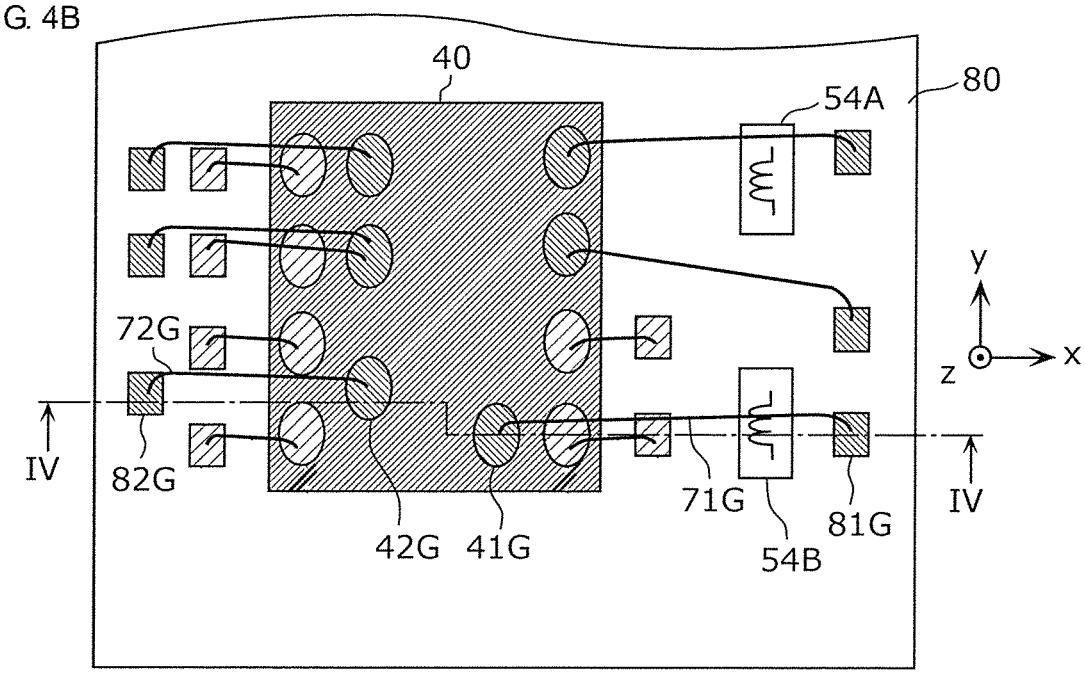

FIGS. 4A and 4B are schematic diagrams illustrating a sectional configuration and a planar configuration, respectively, of a radio-frequency module 1B according to Modification 2 of Embodiment 1. FIG. 4A is a schematic diagram illustrating a sectional configuration of the radio-frequency module 1B. Specifically, FIG. 4A illustrates a section taken along line IV-IV in FIG. 4B. The difference between the radio-frequency module 1B according to the present modification and the radio-frequency module 1 according to Embodiment 1 is only in the layout of the bonding wire bridging over the transmission matching circuit 54B. Configurations common to the radio-frequency module 1B according to the present modification and the radio-frequency module 1 according to Embodiment 1 will be omitted from the following description, which will be given while focusing on distinctive features of the radio-frequency module 1B.

The bonding wire 72G is included in the transmitting circuit. One end of the bonding wire 72G is connected directly to the ground electrode 82G formed on the mounting substrate 80 and the other end of the bonding wire 72G is connected directly to the ground electrode 42G formed on the top surface of the power amplifier circuit 40.

The bonding wire 71G is included in the transmitting circuit. One end of the bonding wire 71G is connected directly to the ground electrode 81G formed on the mounting substrate 80 and the other end of the bonding wire 71G is connected directly to a ground electrode 41G formed on the top surface of the power amplifier circuit 40. As illustrated in FIG. 4A, the bonding wire 71G bridges over (the first inductor of) the transmission matching circuit 54B. Specifically, as illustrated in FIG. 4B, the bonding wire 71G overlaps (the first inductor of) the transmission matching circuit 54B when the mounting substrate 80 is viewed in plan. As illustrated in FIG. 4A, the bonding wire 71G bridges over (the first inductor of) the transmission matching circuit 54B when the mounting substrate 80 is viewed in section.

The bonding wire 71G configured as described above suppresses the occurrence of magnetic coupling between the first inductor of the transmission matching circuit 54B as the inductance component of the transmitting circuit and the inductance component of the receiving circuit. This eliminates or reduces the possibility that a high-power radio-frequency transmission signal amplified by the power amplifier 40A or 40B, harmonic components of the signal, or intermodulation distortion components resulting from mixing of the radio-frequency transmission signal with another radio-frequency signal will flow into the receiving circuit through the magnetic coupling. The transmitting circuit and the receiving circuit consequently have improved isolation characteristics, which eliminate or reduce the possibility that the reception sensitivity of the receiving circuit will degrade.

1.5 Layout of Circuit Elements of Radio-Frequency Module 1C

Figure 5A:
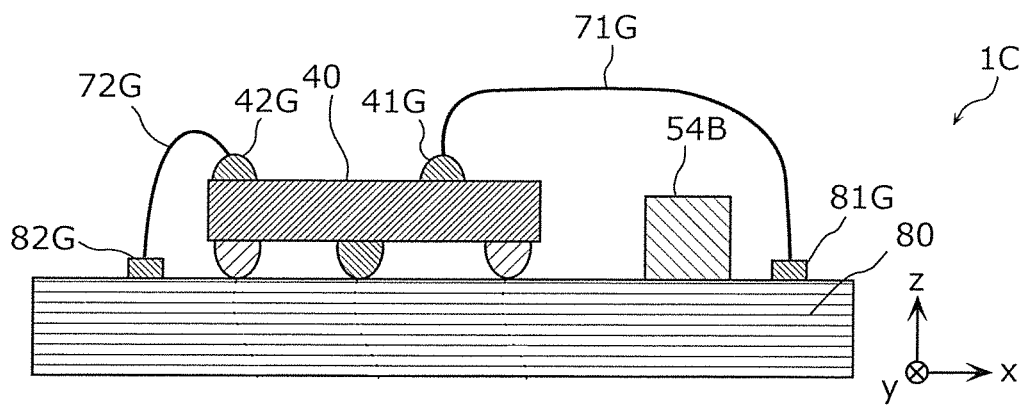
FIGS. 5A and 5B are schematic diagrams illustrating a sectional configuration and a planar configuration, respectively, of a radio-frequency module according to Modification 3 of Embodiment 1.
Figure 5B:
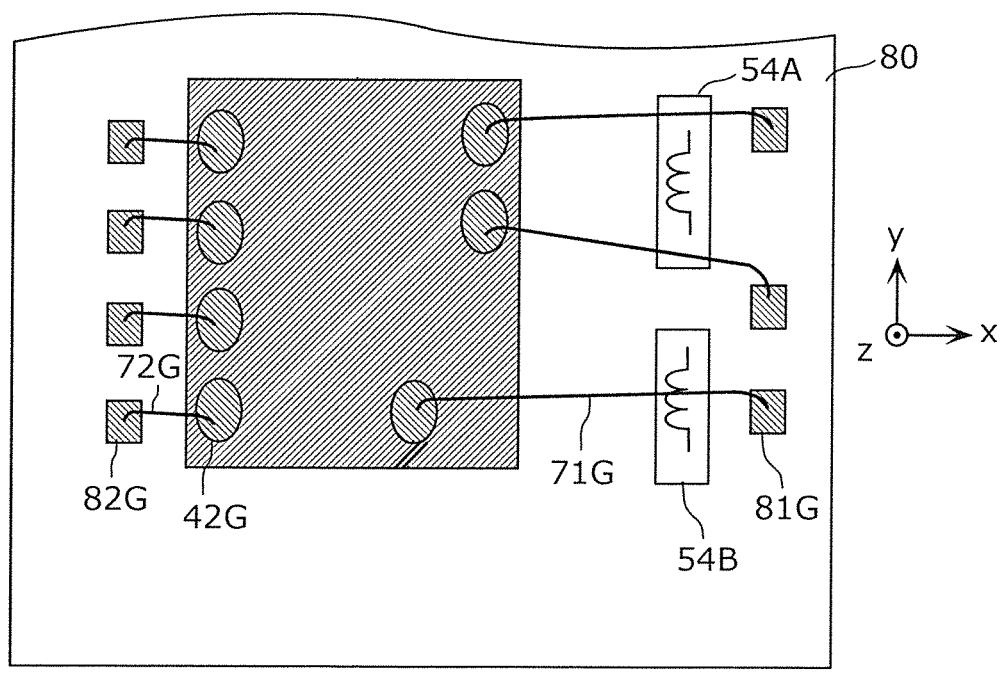

FIGS. 5A and 5B are schematic diagrams illustrating a sectional configuration and a planar configuration, respectively, of a radio-frequency module 1C according to Modification 3 of Embodiment 1. The difference between the radio-frequency module 1C according to the present modification and the radio-frequency module 1B according to Modification 2 is only in the layout of electrodes on the power amplifier circuit 40. Configurations common to the radio-frequency module 1C according to the present modification and the radio-frequency module 1B according to Modification 2 will be omitted from the following description, which will be given while focusing on distinctive features of the radio-frequency module 1C.

In the radio-frequency module 1B according to Modification 2, the electrodes for extracting signals from the power amplifier circuit 40 are formed on the top surface thereof. In the radio-frequency module 1C according to the present modification, meanwhile, electrodes for extracting signals and a ground electrode are formed on a main surface of the power amplifier circuit 40 facing the mounting substrate 80 instead of being formed on the top surface of the power amplifier circuit 40. That is, the power amplifier circuit 40 according to the present modification is mountable onto the mounting substrate 80 by flip-chip (face-down) mounting.

The bonding wire 71G configured as described above according to the present modification also suppresses the occurrence of magnetic coupling between the first inductor of the transmission matching circuit 54B as the inductance component of the transmitting circuit and the inductance component of the receiving circuit. This eliminates or reduces the possibility that a high-power radio-frequency transmission signal amplified by the power amplifier 40A or 40B, harmonic components of the signal, or intermodulation distortion components resulting from mixing of the radio-frequency transmission signal with another radio-frequency signal will flow into the receiving circuit through the magnetic coupling. The transmitting circuit and the receiving circuit consequently have improved isolation characteristics, which eliminate or reduce the possibility that the reception sensitivity of the receiving circuit will degrade.

1.6 Layout of Circuit Elements of Radio-Frequency Module 1D

Figure 6:
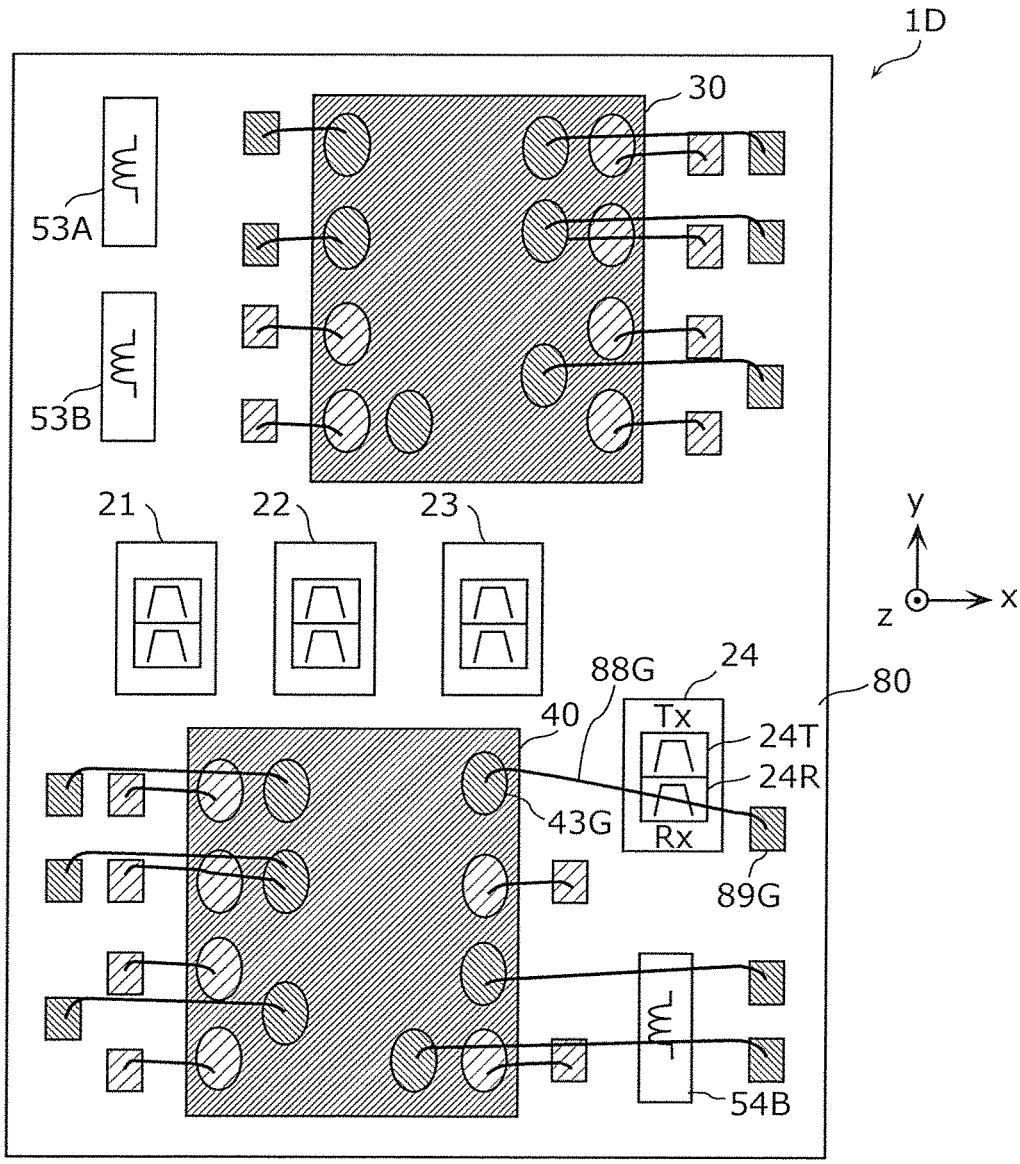
FIG. 6 is a schematic diagram illustrating a planar configuration of a radio-frequency module according to Modification 4 of Embodiment 1.

FIG. 6 is a schematic diagram illustrating a planar configuration of a radio-frequency module 1D according to Modification 4 of Embodiment 1. The difference between the radio-frequency module 1D according to the present modification and the radio-frequency module 1 according to Embodiment 1 is only in the layout of a bonding wire 88G bridging over the receiving filter 24R. Configurations common to the radio-frequency module 1D according to the present modification and the radio-frequency module 1 according to Embodiment 1 will be omitted from the following description, which will be given while focusing on distinctive features of the radio-frequency module 1D.

The bonding wire 88G is a third bonding wire, with one end connected directly to a ground electrode 89G formed on the mounting substrate 80 and the other end connected directly to a ground electrode 43G formed on the top surface of the power amplifier circuit 40. As illustrated in FIG. 6, the bonding wire 88G bridges over the receiving filter 24R.

The bonding wire 88G configured as described above produces a shielding effect, which eliminates or reduces the possibility that radio-frequency transmission signals radiated by the power amplifier circuit 40 will reach the receiving filter 24R. This eliminates or reduces the possibility that a high-power radio-frequency transmission signal amplified by the power amplifier 40A or 40B, harmonic components of the signal, or intermodulation distortion components resulting from mixing of the radio-frequency transmission signal with another radio-frequency signal will flow into the receiving circuit. The transmitting circuit and the receiving circuit consequently have improved isolation characteristics, which eliminate or reduce the possibility that the reception sensitivity of the receiving circuit will degrade.

The bonding wire 88G may bridge over the receiving filter 24R in such a manner that one end and the other end of the bonding wire 88G are connected directly to respective ground electrodes formed on the mounting substrate 80.

In addition to the receiving filter 24R, the receiving filters 21R to 23R may be provided with respective bonding wires 88G connected as described above. That is, at least one of the receiving filters 21R to 24R may be provided with the bonding wire 88G connected as described above.

1.7 Layout of Circuit Elements of Radio-Frequency Module 1E

Figure 7:
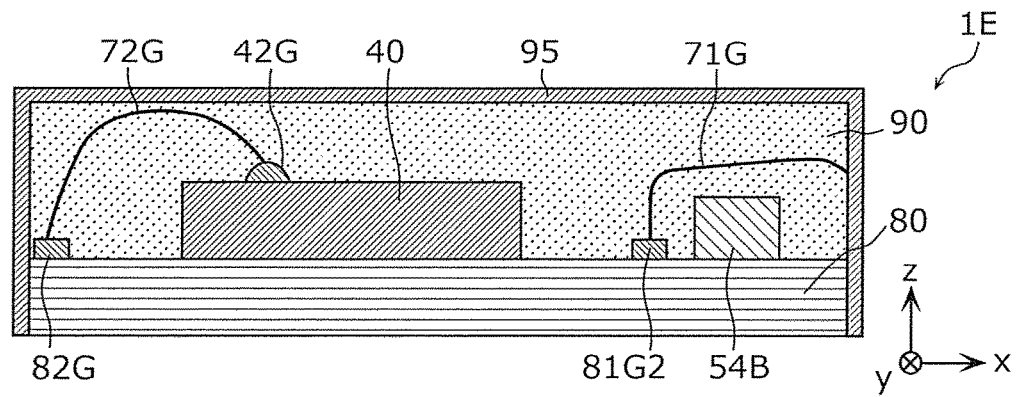
FIG. 7 is a schematic diagram illustrating a sectional configuration of a radio-frequency module according to Modification 5 of Embodiment 1.

FIG. 7 is a schematic diagram illustrating a sectional configuration of a radio-frequency module 1E according to Modification 5 of Embodiment 1. The radio-frequency module 1E according to the present modification differs from the radio-frequency module 1 according to Embodiment 1 in that the radio-frequency module 1E includes a shield electrode layer 95 and another difference between these radio-frequency modules is in the layout of the bonding wire 71G bridging over (the first inductor of) the transmission matching circuit 54B. Configurations common to the radio-frequency module 1E according to the present modification and the radio-frequency module 1 according to Embodiment 1 will be omitted from the following description, which will be given while focusing on distinctive features of the radio-frequency module 1E.

The shield electrode layer 95 is a ground electrode formed so as to cover a top surface and side surfaces of the resin member 90. The shield electrode layer 95 is connected directly to side surfaces of the mounting substrate 80 so as to be connected to the ground electrode pattern formed on the mounting substrate 80.

The bonding wire 71G is included in the transmitting circuit. One end of the bonding wire 71G is connected directly to the ground electrode 81G2 formed on the mounting substrate 80 and the other end of the bonding wire 71G is connected directly to the shield electrode layer 95.

The bonding wire 71G configured as described above suppresses the occurrence of magnetic coupling between the first inductor of the transmission matching circuit 54B as the inductance component of the transmitting circuit and the inductance component of the receiving circuit. This eliminates or reduces the possibility that a high-power radio-frequency transmission signal amplified by the power amplifier 40A or 40B, harmonic components of the signal, or intermodulation distortion components resulting from mixing of the radio-frequency transmission signal with another radio-frequency signal will flow into the receiving circuit through the magnetic coupling. The transmitting circuit and the receiving circuit consequently have improved isolation characteristics, which eliminate or reduce the possibility that the reception sensitivity of the receiving circuit will degrade.

1.8 Layout of Circuit Elements of Radio-Frequency Module 1F

Figure 8A:
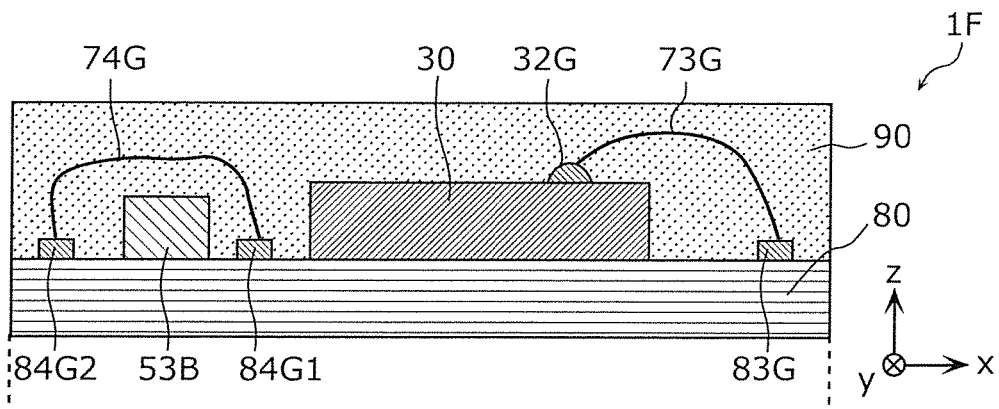
FIGS. 8A and 8B are schematic diagrams illustrating a sectional configuration and a planar configuration, respectively, of a radio-frequency module according to Modification 6 of Embodiment 1.
Figure 8B:
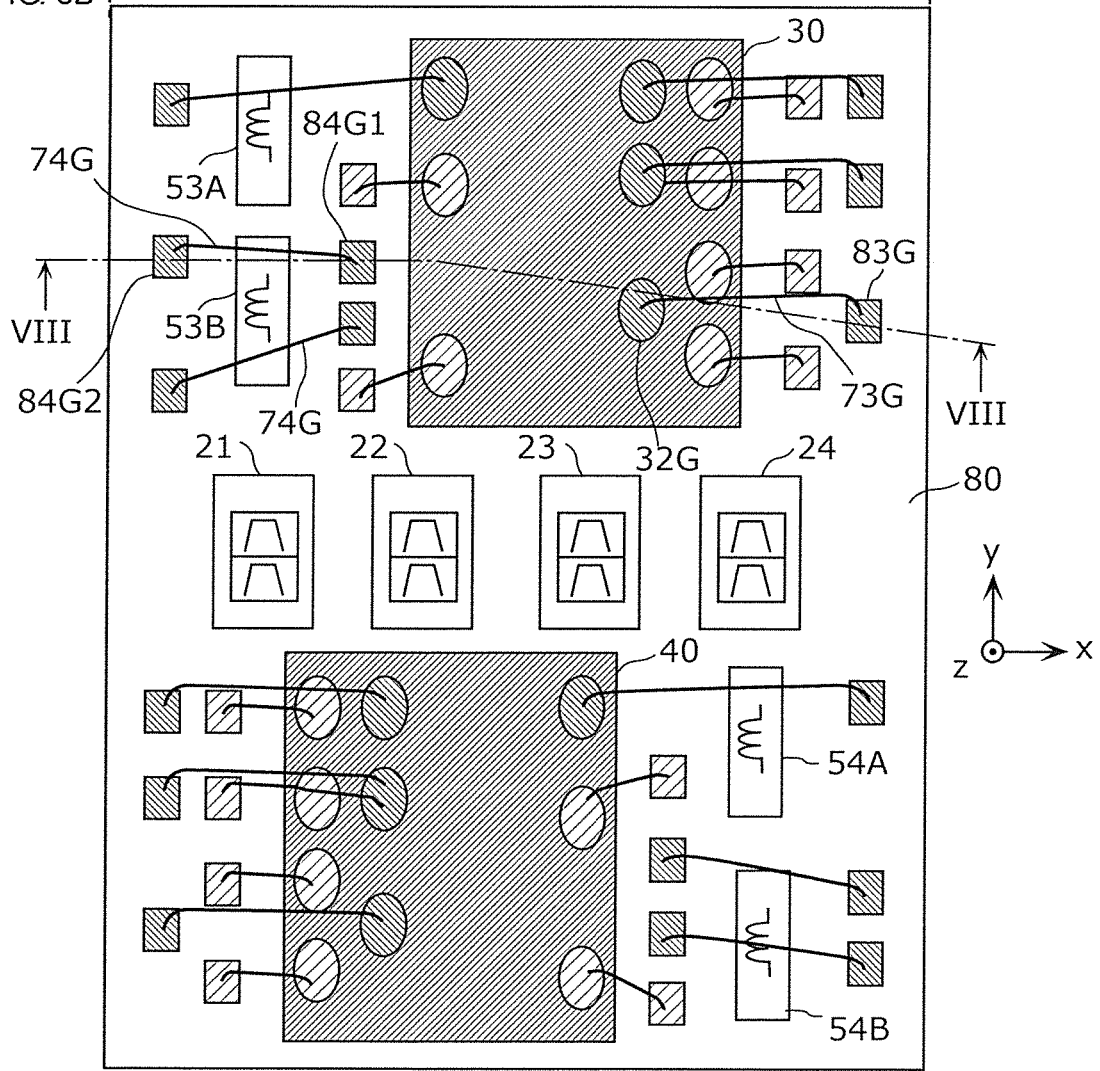

FIGS. 8A and 8B are schematic diagrams illustrating a sectional configuration and a planar configuration, respectively, of a radio-frequency module 1F according to Modification 6 of Embodiment 1. FIG. 8A is a schematic diagram illustrating a sectional configuration of the radio-frequency module 1F. Specifically, FIG. 8A illustrates a section taken along line VIII-VIII in FIG. 8B. The difference between the radio-frequency module 1F according to the present modification and the radio-frequency module 1 according to Embodiment 1 is in the layout of bonding wires disposed on the receiving circuit side. Configurations common to the radio-frequency module 1F according to the present modification and the radio-frequency module 1 according to Embodiment 1 will be omitted from the following description, which will be given while focusing on distinctive features of the radio-frequency module 1F.

The bonding wire 73G is included in the receiving circuit. One end of the bonding wire 73G is connected directly to a ground electrode 32G formed on a top surface of the low-noise amplifier circuit 30 and the other end of the bonding wire 73G is connected directly to a ground electrode 83G formed on the mounting substrate 80.

A bonding wire 74G is included in the receiving circuit. One end of the bonding wire 74G is connected directly to a ground electrode 84G1 formed on the mounting substrate 80 and the other end of the bonding wire 74G is connected directly to a ground electrode 84G2 formed on the mounting substrate 80. That is, the bonding wire 74G is connected to the ground. As illustrated in FIG. 8A, the bonding wire 74G bridges over (the first inductor of) the reception matching circuit 53B. Specifically, as illustrated in FIG. 8B, the bonding wire 74G overlaps (the first inductor of) the reception matching circuit 53B when the mounting substrate 80 is viewed in plan. As illustrated in FIG. 8A, the bonding wire 74G bridges over (the first inductor of) the reception matching circuit 53B when the mounting substrate 80 is viewed in section.

The bonding wire 74G configured as described above suppresses the occurrence of magnetic coupling between the first inductor of the reception matching circuit 53B as the inductance component of the receiving circuit and the inductance component of the transmitting circuit. This eliminates or reduces the possibility that a high-power radio-frequency transmission signal amplified by the power amplifier 40A or 40B, harmonic components of the signal, or intermodulation distortion components resulting from mixing of the radio-frequency transmission signal with another radio-frequency signal will flow into the receiving circuit through the magnetic coupling. The transmitting circuit and the receiving circuit consequently have improved isolation characteristics, which eliminate or reduce the possibility that the reception sensitivity of the receiving circuit will degrade.

The present modification is configured so that the occurrence of the magnetic coupling is suppressed on the receiving circuit side.

As illustrated in FIG. 8B, the bonding wire 74G of the radio-frequency module 1F according to the present embodiment bridges over (the first inductor of) the reception matching circuit 53B alone.

The bonding wire 74G connected to the ground is disposed close to the first inductor of the reception matching circuit 53B accordingly, and this arrangement more effectively suppresses the occurrence of coupling between the magnetic field of the first inductor and the external magnetic field. The transmitting circuit and the receiving circuit consequently have improved isolation characteristics, which effectively eliminate or reduce the possibility that the reception sensitivity of the receiving circuit will degrade.

As illustrated in FIG. 8B, a plurality of bonding wires 74G (a plurality of first bonding wires) connected to the ground may be disposed substantially parallel to each other.

The plurality of bonding wires 74G substantially parallel to each other further suppress the occurrence of coupling between the magnetic field of the first inductor and the external magnetic field. In one embodiment, the bonding wires 74G are considered to be parallel to each other when an angle between the extended imaginary lines of the bonding wires 74G is XX degree or more and XX degree or less. The transmitting circuit and the receiving circuit consequently have improved isolation characteristics, which eliminate or reduce the possibility that the reception sensitivity of the receiving circuit will degrade.

Although not illustrated in FIG. 8, the bonding wires bridging over the first inductor of the reception matching circuit 53B may include the plurality of bonding wires 74G (the plurality of first bonding wires) connected to the ground and substantially parallel to each other and a plurality of second bonding wires intersecting the plurality of bonding wires 74G when the mounting substrate 80 is viewed in plan. In this case, the plurality of bonding wires 74G bridge over (the first inductor of) the reception matching circuit 53B and the plurality of second bonding wires may bridge over (the first inductor of) the reception matching circuit 53B.

The plurality of bonding wires intersecting each other further suppress the occurrence of coupling between the magnetic field of the first inductor and the external magnetic field. The transmitting circuit and the receiving circuit consequently have improved isolation characteristics, which eliminate or reduce the possibility that the reception sensitivity of the receiving circuit will degrade.

In the radio-frequency module 1F according to the present modification, the direction of the magnetic flux (winding axis) of (the first inductor of) the reception matching circuit 53B is desirably perpendicular to the main surface of the mounting substrate 80.

The bonding wire 74G connected to the ground is thus disposed in the direction in which the magnetic flux of (the first inductor of) the reception matching circuit 53B extends, and this configuration further suppresses the occurrence of coupling between the magnetic field of the first inductor and the external magnetic field. The transmitting circuit and the receiving circuit consequently have improved isolation characteristics, which eliminate or reduce the possibility that the reception sensitivity of the receiving circuit will degrade.

The bonding wire 74G may bridge over (the first inductor of) the reception matching circuit 53B and the low-noise amplifier circuit 30.

This configuration suppresses the occurrence of magnetic coupling between the first inductor of the reception matching circuit 53B as the inductance component of the receiving circuit and the inductance component of the transmitting circuit. The bonding wires 74G also produce a shielding effect, which eliminates or reduces the possibility that radio-frequency transmission signals radiated by the transmitting circuit will enter the low-noise amplifiers 30A and 30B. This eliminates or reduces the possibility that a high-power radio-frequency transmission signal amplified by the power amplifier 40A or 40B, harmonic components of the signal, or intermodulation distortion components resulting from mixing of the radio-frequency transmission signal with another radio-frequency signal will flow into the receiving circuit through the magnetic coupling. The transmitting circuit and the receiving circuit consequently have improved isolation characteristics, which eliminate or reduce the possibility that the reception sensitivity of the receiving circuit will degrade.

One end of the bonding wire 74G may be connected directly to the ground electrode formed on the mounting substrate 80 and the other end of the bonding wire 74G may be connected directly to the ground electrode formed on the top surface of the low-noise amplifier circuit 30.

This configuration suppresses the occurrence of magnetic coupling between the first inductor of the reception matching circuit 53B as the inductance component of the receiving circuit and the inductance component of the transmitting circuit.

Embodiment 2

The present embodiment describes the configuration of a radio-frequency module capable of suppressing the occurrence of magnetic coupling between a transmitting circuit and a receiving circuit that transmit radio-frequency signals in their respective communication bands.

2.1 Layout of Circuit Elements of Radio-Frequency Module 1G

Figure 9A:
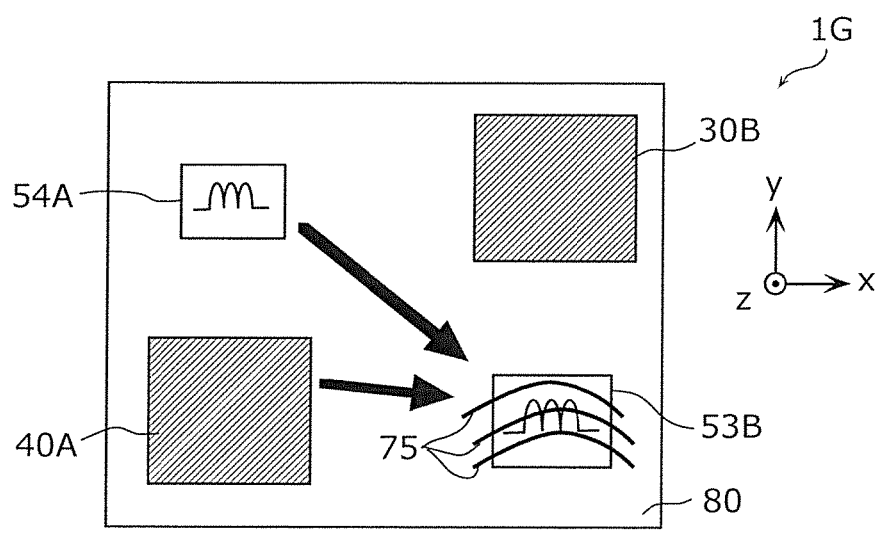
FIGS. 9A and 9B are schematic diagrams illustrating a planar configuration and a sectional configuration, respectively, of a radio-frequency module according to Embodiment 2.
Figure 9B:
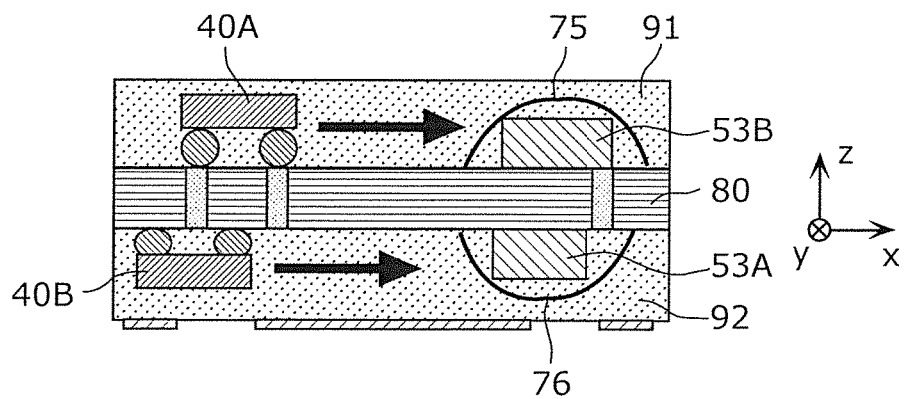

FIGS. 9A and 9B are schematic diagrams illustrating a planar configuration and a sectional configuration, respectively, of a radio-frequency module 1G according to Embodiment 2. As with the radio-frequency module 1 according to Embodiment 1, radio-frequency modules according to the present embodiment and modifications thereof have the circuit configuration illustrated in FIG. 1.

The radio-frequency module 1G according to the present embodiment includes the common terminal 100, the transmission terminals 110A and 110B, the low-noise amplifier circuit 30 (the low-noise amplifiers 30A and 30B), the power amplifier circuit 40 (the power amplifiers 40A and 40B), the duplexers 21, 22, 23, and 24, the transmission matching circuits 54A and 54B, the reception matching circuits 53A and 53B, the matching circuits 61, 62, 63, and 64, the switches 51A, 51B, 52A, 52B, and 55, the mounting substrate 80, bonding wires 75 and 76, and resin members 91 and 92.

The power amplifier 40A, the transmission matching circuit 54A, and the transmitting filter 21T constitute a first transmitting circuit, which outputs radio-frequency transmission signals in the communication band A (the first communication band) to the common terminal 100. The power amplifier 40B, the transmission matching circuit 54B, and the transmitting filter 23T constitute a second transmitting circuit, which outputs radio-frequency transmission signals in the communication band C (the second communication band) to the common terminal 100.

The low-noise amplifier 30A, the reception matching circuit 53A, and the receiving filter 21R constitute a first receiving circuit, which receives, from the antenna 2 via the common terminal 100, radio-frequency reception signals in the communication band A (the first communication band). The low-noise amplifier 30B, the reception matching circuit 53B, and the receiving filter 23R constitute a second receiving circuit, which receives, from the antenna 2 via the common terminal 100, radio-frequency reception signals in the communication band C (the second communication band).

Some of the circuit elements included in the radio-frequency module 1G are illustrated in FIGS. 9A and 9B.

As illustrated in FIG. 9B, the mounting substrate 80 has a first main surface and a second main surface opposed to each other. The power amplifier 40A, the low-noise amplifier 30B, the transmission matching circuit 54A, the reception matching circuit 53B, and the bonding wires 75 are mounted on the first main surface of the mounting substrate 80. The power amplifier 40B, the low-noise amplifier 30A (not illustrated), the transmission matching circuit 54B (not illustrated), the reception matching circuit 53A, and the bonding wires 76 are mounted on the second main surface of the mounting substrate 80.

The bonding wires 75 are included in the receiving circuit and both ends of each bonding wire 75 are connected directly to respective ground electrodes formed on the first main surface of the mounting substrate 80. That is, the bonding wires 75 are connected to the ground. As illustrated in FIG. 9B, the bonding wires 75 bridge over (the first inductor of) the reception matching circuit 53B. Specifically, as illustrated in FIG. 9A, the bonding wires 75 overlap (the first inductor of) the reception matching circuit 53B when the mounting substrate 80 is viewed in plan. As illustrated in FIG. 9B, each bonding wire 75 bridges over (the first inductor of) the reception matching circuit 53B when the mounting substrate 80 is viewed in section. That is, the reception matching circuit 53B includes the first inductor bridged over by the bonding wires 75.

The bonding wires 75 configured as described above suppress the occurrence of magnetic coupling between the first inductor of the reception matching circuit 53B as the inductance component of the second receiving circuit and the inductance component of the transmission matching circuit 54A of the first transmitting circuit. The bonding wires 75 also produce a shielding effect, which eliminates or reduces the possibility that radio-frequency transmission signals radiated by the power amplifier 40A of the first transmitting circuit will enter the reception matching circuit 53B. This eliminates or reduces the possibility that a high-power radio-frequency transmission signal amplified by the power amplifier 40A of the first transmitting circuit, harmonic components of the signal, or intermodulation distortion components resulting from mixing of the radio-frequency transmission signal with another radio-frequency signal will flow into the second receiving circuit through the magnetic coupling. The transmitting circuit and the receiving circuit consequently have improved isolation characteristics, which eliminate or reduce the possibility that the reception sensitivity of the second receiving circuit will degrade.

The bonding wires 76 are included in the receiving circuit and both ends of each bonding wire 76 are connected directly to respective ground electrodes formed on the second main surface of the mounting substrate 80. That is, the bonding wires 76 are connected to the ground. As illustrated in FIG. 9B, the bonding wires 76 bridge over (the first inductor of) the reception matching circuit 53A. Specifically, the bonding wires 76 overlap (the first inductor of) the reception matching circuit 53A when the mounting substrate 80 is viewed in plan. As illustrated in FIG. 9B, each bonding wire 76 bridges over (the first inductor of) the reception matching circuit 53A when the mounting substrate 80 is viewed in section. That is, the reception matching circuit 53A includes the first inductor bridged over by the bonding wires 76.

The bonding wires 76 configured as described above suppress the occurrence of magnetic coupling between the first inductor of the reception matching circuit 53A as the inductance component of the first receiving circuit and the inductance component of the transmission matching circuit 54B of the second transmitting circuit. The bonding wires 76 also produce a shielding effect, which eliminates or reduces the possibility that radio-frequency transmission signals radiated by the power amplifier 40B of the second transmitting circuit will enter the reception matching circuit 53A. This eliminates or reduces the possibility that a high-power radio-frequency transmission signal amplified by the power amplifier 40B of the second transmitting circuit, harmonic components of the signal, or intermodulation distortion components resulting from mixing of the radio-frequency transmission signal with another radio-frequency signal will flow into the first receiving circuit through the magnetic coupling. The transmitting circuit and the receiving circuit consequently have improved isolation characteristics, which eliminate or reduce the possibility that the reception sensitivity of the first receiving circuit will degrade.

The reception matching circuits 53A and 53B are bridged over by the bonding wires in the present embodiment. Alternatively, the transmission matching circuits 54A and 54B may be bridged over by the bonding wires.

This configuration suppresses the occurrence of magnetic coupling between the first inductor of the transmission matching circuit 54A or 54B as the inductance component of the transmitting circuit and the inductance component of the receiving circuit. This eliminates or reduces the possibility that a high-power radio-frequency transmission signal amplified by the power amplifier 40A or 40B, harmonic components of the signal, or intermodulation distortion components resulting from mixing of the radio-frequency transmission signal with another radio-frequency signal will flow into the receiving circuit through the magnetic coupling. The transmitting circuit and the receiving circuit consequently have improved isolation characteristics, which eliminate or reduce the possibility that the reception sensitivity of the receiving circuit will degrade.

2.2 Layout of Circuit Elements of Radio-Frequency Module 1H

FIGS. 10A and 10B are schematic diagrams illustrating a planar configuration and a sectional configuration, respectively, of a radio-frequency module 1H according to Modification 7 of Embodiment 2. The difference between the radio-frequency module 1H according to the present modification and the radio-frequency module 1G according to Embodiment 2 is in the layout of bonding wires disposed over the low-noise amplifier 30B. Configurations common to the radio-frequency module 1H according to the present modification and the radio-frequency module 1G according to Embodiment 2 will be omitted from the following description, which will be given while focusing on distinctive features of the radio-frequency module 1H.

Bonding wires 77 are included in the receiving circuit and laid out in the same fashion as the bonding wires 75 of the radio-frequency module 1G according to Embodiment 2. Bonding wires 79 are laid out in the same fashion as the bonding wires 76 of the radio-frequency module 1G according to Embodiment 2.

Bonding wires 78 are included in the receiving circuit and both ends of each bonding wire 78 are connected directly to respective ground electrodes formed on the first main surface of the mounting substrate 80. That is, the bonding wires 78 are connected to the ground. The bonding wires 78 bridge over the low-noise amplifier 30B. Specifically, as illustrated in FIG. 10A, the bonding wires 78 overlap the low-noise amplifier 30B when the mounting substrate 80 is viewed in plan. The bonding wires 78 bridge over the low-noise amplifier 30B when the mounting substrate 80 is viewed in section.

The bonding wires 77 and 78 configured as described above produce a shielding effect, which eliminates or reduces the possibility that radio-frequency transmission signals radiated by the power amplifier 40A of the first transmitting circuit will enter the second receiving circuit. This eliminates or reduces the possibility that a high-power radio-frequency transmission signal amplified by the power amplifier 40A of the first transmitting circuit, harmonic components of the signal, or intermodulation distortion components resulting from mixing of the radio-frequency transmission signal with another radio-frequency signal will flow into the second receiving circuit through the magnetic coupling. The transmitting circuit and the receiving circuit consequently have improved isolation characteristics, which eliminate or reduce the possibility that the reception sensitivity of the second receiving circuit will degrade.

Although not illustrated in FIGS. 10A and 10B, the bonding wires in contact with the ground electrode may overlap the low-noise amplifier 30A in the plan view and may bridge over the low-noise amplifier 30A in the sectional view.

As illustrated on the right side of FIG. 10A, the bonding wires in contact with the ground electrode may overlap the reception matching circuit 53B and the low-noise amplifier 30B in the plan view and may bridge over the reception matching circuit 53B and the low-noise amplifier 30B in the sectional view.

2.3 Layout of Circuit Elements of Radio-Frequency Module 1J

Figure 11A:
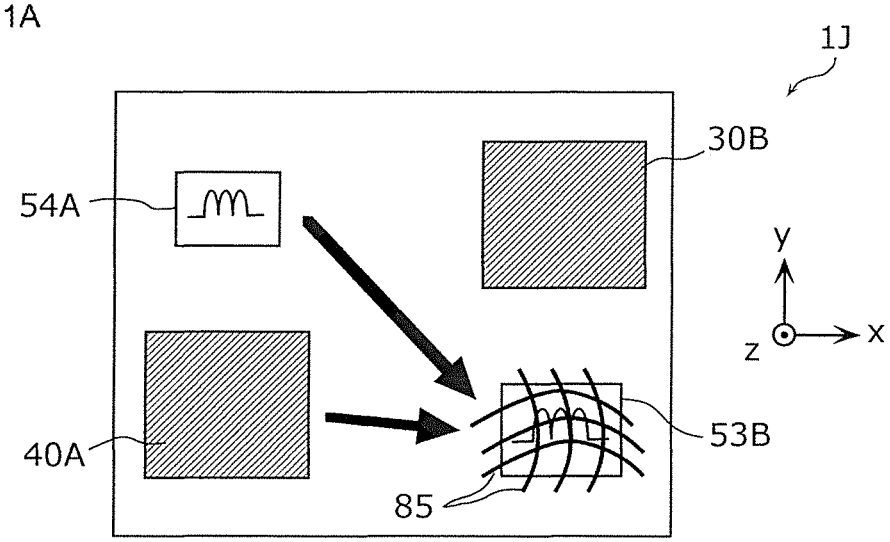
FIGS. 11A and 11B are schematic diagrams illustrating a planar configuration and a sectional configuration, respectively, of a radio-frequency module according to Modification 8 of Embodiment 2.
Figure 11B:
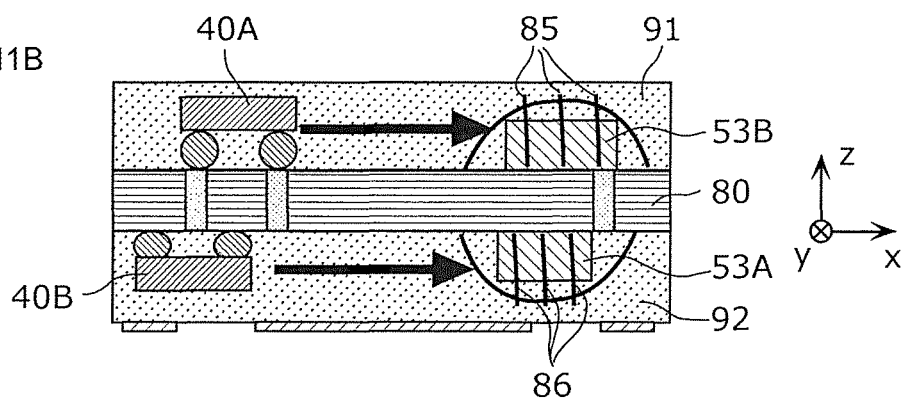

FIGS. 11A and 11B are schematic diagrams illustrating a planar configuration and a sectional configuration, respectively, of a radio-frequency module 1J according to Modification 8 of Embodiment 2. The difference between the radio-frequency module 1J according to the present modification and the radio-frequency module 1G according to Embodiment 2 is in the layout of bonding wires disposed over the reception matching circuits 53A and 53B. Configurations common to the radio-frequency module 1J according to the present modification and the radio-frequency module 1G according to Embodiment 2 will be omitted from the following description, which will be given while focusing on distinctive features of the radio-frequency module 1J.

Bonding wires 85 are included in the receiving circuit and both ends of each bonding wire 85 are connected directly to respective ground electrodes formed on the first main surface of the mounting substrate 80. That is, the bonding wires 85 are connected to the ground. As illustrated in FIG. 11B, the bonding wires 85 bridge over (the first inductor of) the reception matching circuit 53B. Specifically, as illustrated in FIG. 11A, the bonding wires 85 overlap (the first inductor of) the reception matching circuit 53B when the mounting substrate 80 is viewed in plan. As illustrated in FIG. 11B, each bonding wire 85 bridges over (the first inductor of) the reception matching circuit 53B when the mounting substrate 80 is viewed in section. The bonding wires 85 include first bonding wires parallel to each other and second bonding wires intersecting the first bonding wires and parallel to each other. Each of the first bonding wires may be in contact with the second bonding wires at the points of intersection found in the plan view.

The bonding wires 85 configured as described above suppress the occurrence of magnetic coupling between the first inductor of the reception matching circuit 53B as the inductance component of the second receiving circuit and the inductance component of the transmission matching circuit 54A of the first transmitting circuit. The bonding wires 85 also produce a shielding effect, which eliminates or reduces the possibility that radio-frequency transmission signals radiated by the power amplifier 40A of the first transmitting circuit will enter the reception matching circuit 53B.

Bonding wires 86 are included in the receiving circuit and both ends of each bonding wire 86 are connected directly to respective ground electrodes formed on the second main surface of the mounting substrate 80. That is, the bonding wires 86 are connected to the ground. As illustrated in FIG. 11B, the bonding wires 86 bridge over (the first inductor of) the reception matching circuit 53A. Specifically, the bonding wires 86 overlap (the first inductor of) the reception matching circuit 53A when the mounting substrate 80 is viewed in plan. As illustrated in FIG. 11B, each bonding wire 86 bridges over (the first inductor of) the reception matching circuit 53A when the mounting substrate 80 is viewed in section. The bonding wires 86 include first bonding wires parallel to each other and second bonding wires intersecting the first bonding wires and parallel to each other. Each of the first bonding wires may be in contact with the second bonding wires at the points of intersection found in the plan view.

The bonding wires 86 configured as described above suppress the occurrence of magnetic coupling between the first inductor of the reception matching circuit 53A as the inductance component of the first receiving circuit and the inductance component of the transmission matching circuit 54B of the second transmitting circuit. The bonding wires 86 also produce a shielding effect, which eliminates or reduces the possibility that radio-frequency transmission signals radiated by the power amplifier 40B of the second transmitting circuit will enter the reception matching circuit 53A.

2.4 Layout of Circuit Elements of Radio-Frequency Module 1K

Figure 12A:
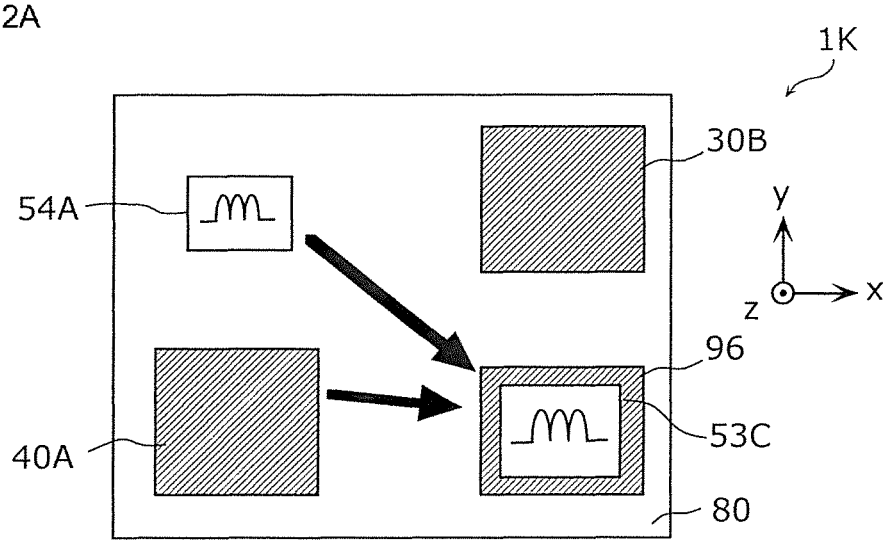
FIGS. 12A and 12B are schematic diagrams illustrating a planar configuration and a sectional configuration, respectively, of a radio-frequency module according to Modification 9 of Embodiment 2.
Figure 12B:
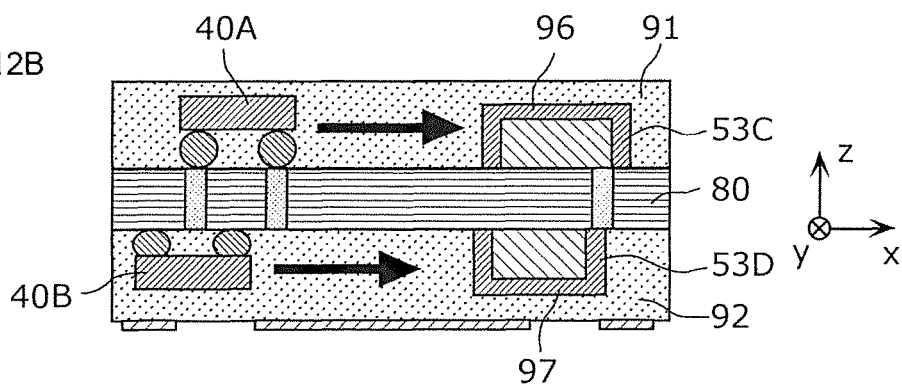

FIGS. 12A and 12B are schematic diagrams illustrating a planar configuration and a sectional configuration, respectively, of a radio-frequency module 1K according to Modification 9 of Embodiment 2. The radio-frequency module 1K according to the present modification differs from the radio-frequency module 1G according to Embodiment 2 in that conductive caps are provided and that no bonding wires are disposed over the reception matching circuits 53A and 53B. Configurations common to the radio-frequency module 1K according to the present modification and the radio-frequency module 1G according to Embodiment 2 will be omitted from the following description, which will be given while focusing on distinctive features of the radio-frequency module 1K.

A conductive cap 96 is a conductive member connected to the ground. Of the circuit elements constituting a reception matching circuit 53C of the second receiving circuit, the first inductor alone is covered with the conductive cap 96 and the mounting substrate 80.

The conductive cap 96 configured as described above suppresses the occurrence of magnetic coupling between the first inductor of the reception matching circuit 53C as the inductance component of the second receiving circuit and the inductance component of the transmission matching circuit 54A of the first transmitting circuit. The conductive cap 96 also produces a shielding effect, which eliminates or reduces the possibility that radio-frequency transmission signals radiated by the power amplifier 40A of the first transmitting circuit will enter the reception matching circuit 53C. This eliminates or reduces the possibility that a high-power radio-frequency transmission signal amplified by the power amplifier 40A of the first transmitting circuit, harmonic components of the signal, or intermodulation distortion components resulting from mixing of the radio-frequency transmission signal with another radio-frequency signal will flow into the second receiving circuit through the magnetic coupling. The transmitting circuit and the receiving circuit consequently have improved isolation characteristics, which eliminate or reduce the possibility that the reception sensitivity of the second receiving circuit will degrade.

A conductive cap 97 is a conductive member connected to the ground. Of the circuit elements constituting a reception matching circuit 53D of the first receiving circuit, the first inductor alone is covered with the conductive cap 97 and the mounting substrate 80.

The conductive cap 97 configured as described above suppresses the occurrence of magnetic coupling between the first inductor of the reception matching circuit 53D as the inductance component of the first receiving circuit and the inductance component of the transmission matching circuit 54B of the second transmitting circuit. The conductive cap 97 also produces a shielding effect, which eliminates or reduces the possibility that radio-frequency transmission signals radiated by the power amplifier 40B of the second transmitting circuit will enter the reception matching circuit 53D. This eliminates or reduces the possibility that a high-power radio-frequency transmission signal amplified by the power amplifier 40B of the second transmitting circuit, harmonic components of the signal, or intermodulation distortion components resulting from mixing of the radio-frequency transmission signal with another radio-frequency signal will flow into the first receiving circuit through the magnetic coupling. The transmitting circuit and the receiving circuit consequently have improved isolation characteristics, which eliminate or reduce the possibility that the reception sensitivity of the first receiving circuit will degrade.

2.5 Layout of Circuit Elements of Radio-Frequency Module 1L

Figure 13A:
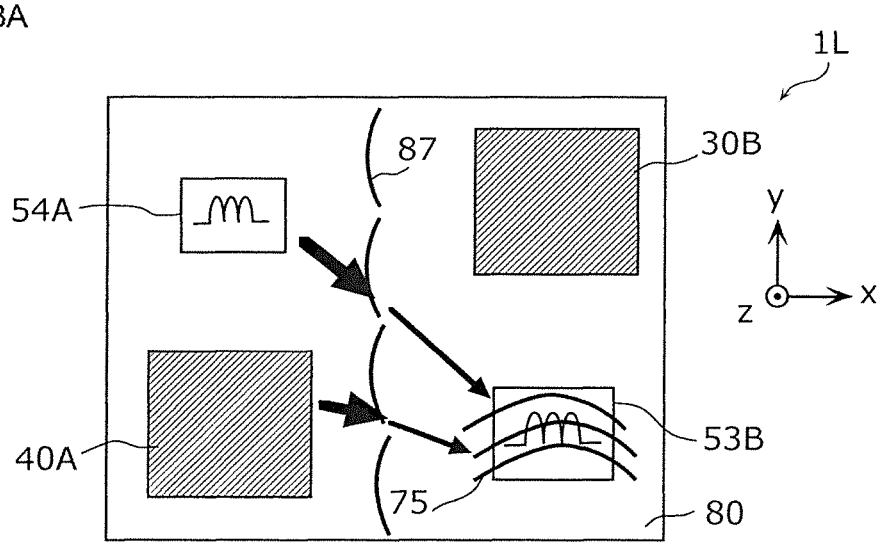
FIGS. 13A and 13B are schematic diagrams illustrating a planar configuration and a sectional configuration, respectively, of a radio-frequency module according to Modification 10 of Embodiment 2.
Figure 13B:
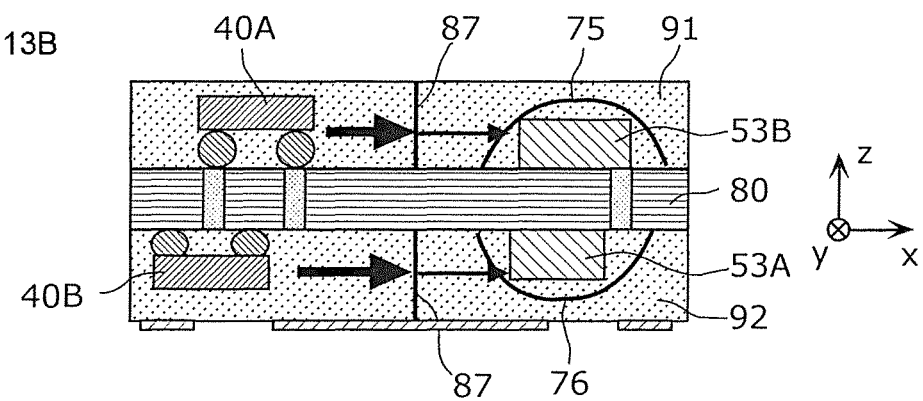

FIGS. 13A and 13B are schematic diagrams illustrating a planar configuration and a sectional configuration, respectively, of a radio-frequency module 1L according to Modification 10 of Embodiment 2. The radio-frequency module 1L according to the present modification differs from the radio-frequency module 1G according to Embodiment 2 in that bonding wires 87 are disposed between the transmitting circuit and the receiving circuit. Configurations common to the radio-frequency module 1L according to the present modification and the radio-frequency module 1G according to Embodiment 2 will be omitted from the following description, which will be given while focusing on distinctive features of the radio-frequency module 1L.

Some of the bonding wires 87 have two ends that are connected directly to respective ground electrodes on the mounting substrate 80 and are disposed in such a manner that the power amplifier 40A and the transmission matching circuit 54A face the low-noise amplifier 30B and the reception matching circuit 53B via the bonding wires 87 therebetween when the first main surface of the mounting substrate is viewed in plan.

The other bonding wires 87 have two ends that are connected directly to respective ground electrodes on the mounting substrate 80 and are disposed in such a manner that the power amplifier 40B and the transmission matching circuit 54B face the low-noise amplifier 30A and the reception matching circuit 53A via the bonding wires 87 therebetween when the second main surface of the mounting substrate is viewed in plan.

That is, when the mounting substrate is viewed in plan, some of the bonding wires 87 are formed between the first transmitting circuit and the second receiving circuit and the other bonding wires 87 are formed between the second transmitting circuit and the first receiving circuit.

Alternatively, the bonding wires 87 may be disposed between the first transmitting circuit and the second receiving circuit or between the second transmitting circuit and the first receiving circuit.

This configuration suppresses the occurrence of magnetic coupling between the inductance component of the transmitting circuit and the inductance component of the receiving circuit. The bonding wires 87 also produce a shielding effect, which eliminates or reduces the possibility that radio-frequency transmission signals radiated by the power amplifier of the transmitting circuit will enter the receiving circuit. This eliminates or reduces the possibility that a high-power radio-frequency transmission signal amplified by the power amplifier of the transmitting circuit, harmonic components of the signal, or intermodulation distortion components resulting from mixing of the radio-frequency transmission signal with another radio-frequency signal will flow into the receiving circuit through the magnetic coupling. The transmitting circuit and the receiving circuit consequently have improved isolation characteristics, which eliminate or reduce the possibility that the reception sensitivity of the receiving circuit will degrade.

2.6 Layout of Circuit Elements of Radio-Frequency Module 1M

Figure 14A:
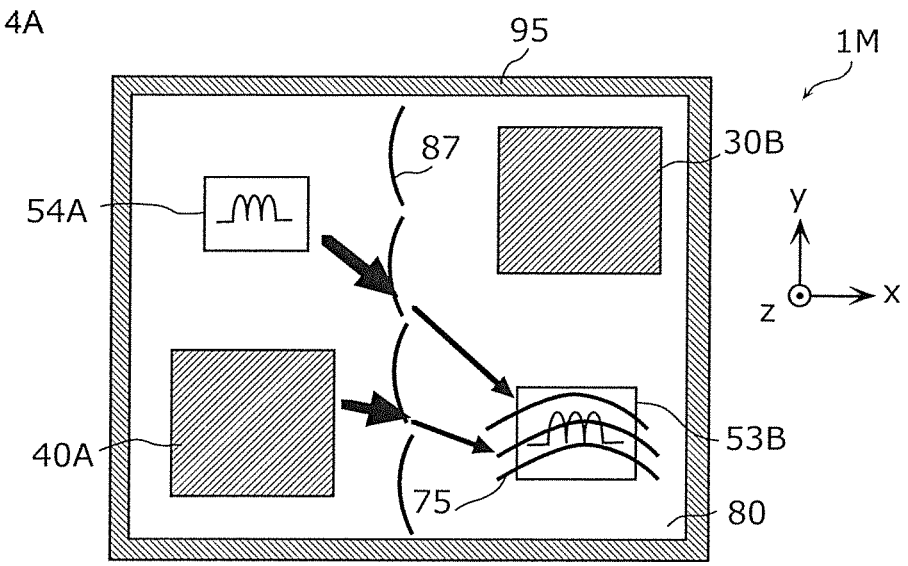
FIGS. 14A and 14B are schematic diagrams illustrating a planar configuration and a sectional configuration, respectively, of a radio-frequency module according to Modification 11 of Embodiment 2.
Figure 14B:
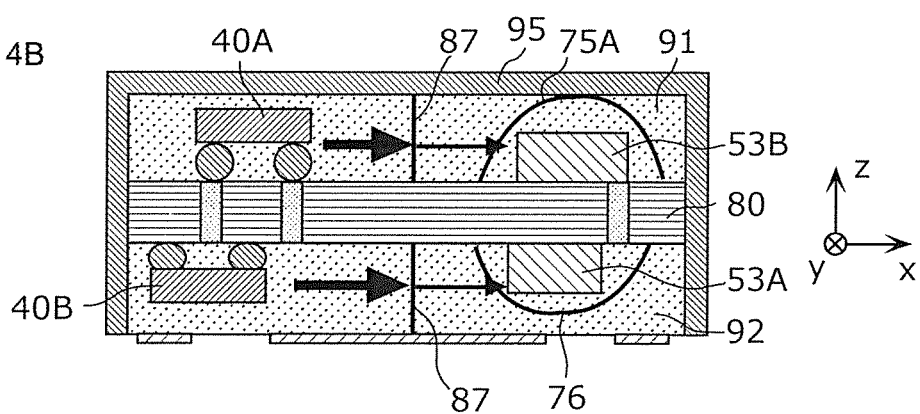

FIGS. 14A and 14B are schematic diagrams illustrating a planar configuration and a sectional configuration, respectively, of a radio-frequency module 1M according to Modification 11 of Embodiment 2. The radio-frequency module 1M according to the present modification differs from the radio-frequency module 1L according to Modification 10 in that the shield electrode layer 95 is provided, with bonding wires 75A in contact with the shield electrode layer 95. Configurations common to the radio-frequency module 1M according to the present modification and the radio-frequency module 1L according to Modification 10 will be omitted from the following description, which will be given while focusing on distinctive features of the radio-frequency module 1M.

The shield electrode layer 95 is a ground electrode formed so as to cover a top surface and side surfaces of the resin member 91 and side surfaces of the resin member 92. The shield electrode layer 95 is connected directly to the side surfaces of the mounting substrate 80 so as to be connected to the ground electrode pattern formed on the mounting substrate 80.

One end and the other end of each of the bonding wires 75A are connected directly to respective ground electrodes formed on the first main surface of the mounting substrate 80. That is, the bonding wires 75A are connected to the ground. As illustrated in FIG. 14B, the bonding wires 75A bridge over (the first inductor of) the reception matching circuit 53B. Specifically, as illustrated in FIG. 14A, the bonding wires 75A overlap (the first inductor of) the reception matching circuit 53B when the mounting substrate 80 is viewed in plan. As illustrated in FIG. 14B, each bonding wire 75A bridges over (the first inductor of) the reception matching circuit 53B when the mounting substrate 80 is viewed in section. Each bonding wire 75A is in contact with the shield electrode layer 95. Furthermore, each bonding wire 87 is in contact with the shield electrode layer 95.

This configuration suppresses the occurrence of magnetic coupling between the first inductor of the reception matching circuit 53B as the inductance component of the second receiving circuit and the inductance component of the transmission matching circuit 54A of the first transmitting circuit. The contact between the bonding wires 75A and the shield electrode layer 95 further suppresses the occurrence of the magnetic coupling. This eliminates or reduces the possibility that a high-power radio-frequency transmission signal amplified by the power amplifier 40A of the first transmitting circuit, harmonic components of the signal, or intermodulation distortion components resulting from mixing of the radio-frequency transmission signal with another radio-frequency signal will flow into the second receiving circuit through the magnetic coupling. The transmitting circuit and the receiving circuit consequently have improved isolation characteristics, which eliminate or reduce the possibility that the reception sensitivity of the second receiving circuit will degrade.

Other Embodiments

Embodiments 1 and 2 and modifications thereof have been described so far as examples of the radio-frequency module and the communication device according to the present disclosure. However, the radio-frequency module and the communication device according to the present disclosure are not limited to the embodiments above and modifications thereof. The present disclosure embraces other embodiments implemented by varying combinations of constituent components of the embodiments above and the modifications thereof, other modifications achieved through various alterations to the embodiments above and modifications thereof that may be conceived by those skilled in the art within a range not departing from the spirit of the present disclosure, and various types of apparatuses including the radio-frequency module and the communication device.

In Embodiments 1 and 2 and the modifications thereof, the bonding wires are connected to the ground with respect to at least one of the first inductor of the transmission matching circuit included in the transmitting circuit and the first inductor the reception matching circuit included in the receiving circuit, the bonding wires overlap the first inductor when the mounting substrate is viewed in plan, and the bonding wires bridge over the first inductor when the mounting substrate is viewed in section. Alternatively, the radio-frequency module according to the present disclosure may include no bonding wires disposed over the matching circuit included in the transmitting circuit or in the receiving circuit and may include a bonding wire connected to the ground with respect to at least one of the first inductors included in the respective matching circuits 61 to 64 illustrated in FIG. 1, overlapping the first inductor when the mounting substrate is viewed in plan, and bridging over the first inductor when the mounting substrate is viewed in section.

That is, the radio-frequency module including the transmitting circuit and the receiving circuit disposed on the mounting substrate 80 is to include: a first inductor connected between the common terminal 100 and the connection nodes of the transmitting circuit and the receiving circuit to provide impedance matching; and a bonding wire connected to the ground and bridging over the first inductor.

In this case, each of the matching circuits 61 to 64 includes a first inductor that matches the impedance of the circuit element (the antenna 2) connected to the common terminal 100 to the impedance of a corresponding transmitting filter and a corresponding receiving filter.

Each bonding wire configured as described above suppresses the occurrence of magnetic coupling between the inductance component of the receiving circuit and any one of the first inductors included in the respective matching circuits 61 to 64 through which radio-frequency transmission signals pass. In some embodiments, each bonding wire suppresses the occurrence of magnetic coupling between the inductance component of the transmitting circuit and any one of the first inductors included in the respective matching circuits 61 to 64 through which radio-frequency transmission signals pass.

This eliminates or reduces the possibility that a high-power radio-frequency transmission signal amplified by the power amplifier 40A or 40B, harmonic components of the signal, or intermodulation distortion components resulting from mixing of the radio-frequency transmission signal with another radio-frequency signal will flow into the receiving circuit through the magnetic coupling. The transmitting circuit and the receiving circuit consequently have improved isolation characteristics, which eliminate or reduce the possibility that the reception sensitivity of the receiving circuit will degrade.

In each of the radio-frequency modules according to Embodiments 1 and 2 and modifications thereof, the paths forming connections between the circuit elements and the signal paths illustrated in the drawings may also include, for example, other circuit elements and wiring.

The present disclosure may be widely used as radio-frequency modules having multi-band features and disposed in front-end portions of communication devices such as mobile phones.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A radio-frequency module comprising:
   a common terminal, a transmission terminal, and a reception terminal;
   a transmitting circuit disposed on a mounting substrate to process a radio-frequency signal input from the transmission terminal and to output a resultant signal to the common terminal;
   a receiving circuit disposed on the mounting substrate to process a radio-frequency signal input from the common terminal and to output a resultant signal to the reception terminal, wherein:
   the transmitting circuit includes a first transmitting filter and a second transmitting filter;
   the transmitting circuit includes a first inductor and a bonding wire connected to a ground, and
   the bonding wire bridges over the first inductor;
   a first switch configured to selectively connect the first inductor to the first transmitting filter and the second transmitting filter; and
   a second switch connected between the common terminal and the first inductor, said second switch configured to selectively connect the common terminal to the first transmitting filter and the second transmitting filter, wherein
   the first inductor comprises an inductor connected to an output terminal of a power amplifier that amplifies a radio-frequency signal input from the transmission terminal, the inductor being disposed between the output terminal of the power amplifier and the first switch,
   the transmitting circuit includes the power amplifier and the first inductor, and
   one end of the bonding wire is connected directly to a ground electrode on one of two opposed main surfaces of the power amplifier that is farther from the mounting substrate and the other end of the bonding wire is connected directly to a ground electrode on the mounting substrate, the bonding wire disposed closely to the power amplifier bridges over the inductor.

2. The radio-frequency module according to claim 1, wherein
   the transmitting circuit includes
      a first transmitting circuit that transmits a radio-frequency signal in a first communication band, and
      a second transmitting circuit that transmits a radio-frequency signal in a second communication band, the first and second communication bands being different frequency bands,
   the receiving circuit includes
      a first receiving circuit that receives a radio-frequency signal in the first communication band,
      a second receiving circuit that receives a radio-frequency signal in the second communication band,
   the first receiving circuit includes
      a first low-noise amplifier that outputs a radio-frequency signal in the first communication band to a first reception terminal, and
      a first reception matching inductor connected to an input terminal of the first low-noise amplifier.

3. A radio-frequency module according to claim 2, further comprising a bonding wire connected to the ground, the bonding wire being disposed between the first transmitting circuit and the second receiving circuit when the mounting substrate is viewed in plan, the mounting substrate having a first main surface and a second main surface opposed to each other, the first transmitting circuit and the second receiving circuit being mounted on the first main surface, the second transmitting circuit and the first receiving circuit being mounted on the second main surface.

4. The radio-frequency module according to claim 1, wherein
   the bonding wire includes a plurality of first bonding wires connected to the ground and parallel to each other, and
   the plurality of first bonding wires bridge over the first inductor.

5. The radio-frequency module according to claim 1, wherein
   the bonding wire includes a plurality of first bonding wires connected to the ground and parallel to each other and a plurality of second bonding wires intersecting the plurality of first bonding wires, and the plurality of first bonding wires and the plurality of second bonding wires bridge over the first inductor.

6. The radio-frequency module according to claim 1, wherein:

the receiving circuit includes a receiving filter, and when the mounting substrate is viewed in plan, the first transmitting filter, the second transmitting filter, and the receiving filter are disposed on or around a boundary between a region in which the transmitting circuit is disposed and a region in which the receiving circuit is disposed.

7. The radio-frequency module according to claim 6, further comprising a third bonding wire connected to the ground, wherein the third bonding wire overlaps the receiving filter when the mounting substrate is viewed in plan, and bridges over the receiving filter when the mounting substrate is viewed in section.

8. The radio-frequency module according to claim 1, wherein a direction of a magnetic flux of the first inductor is perpendicular to one of the main surfaces of the mounting substrate.

9. A communication device comprising:

a radio-frequency signal processing circuit that processes the radio-frequency signal transmitted or received via an antenna; and the radio-frequency module according to claim 1, the radio-frequency module transmitting the radio-frequency signal between the antenna and the radio-frequency signal processing circuit.

10. The radio-frequency module according to claim 1, wherein the bonding wire includes a plurality of first bonding wires connected to the ground and parallel to each other, and the plurality of first bonding wires bridge over the first inductor.

* * * * *